United States Patent
Santos Rodriguez et al.

(10) Patent No.: US 10,699,934 B2
(45) Date of Patent: Jun. 30, 2020

(54) SUBSTRATE CARRIER, A PROCESSING ARRANGEMENT AND A METHOD

(71) Applicant: Infineon Technologies AG, Neubiberg (DE)

(72) Inventors: Francisco Javier Santos Rodriguez, Villach (AT); Roland Rupp, Erlangen (DE); Ronny Kern, Finkenstein (AT); Josef Unterweger, Annenheim (AT)

(73) Assignee: Infineon Technologies AG, Neubiberg (DE)

( * ) Notice: Subject to any disclaimer, the term of this patent is extended or adjusted under 35 U.S.C. 154(b) by 872 days.

(21) Appl. No.: 14/872,184

(22) Filed: Oct. 1, 2015

(65) Prior Publication Data

US 2017/0098570 A1     Apr. 6, 2017

(51) Int. Cl.
 *H01L 21/683* (2006.01)
(52) U.S. Cl.
 CPC ............... *H01L 21/6838* (2013.01)
(58) Field of Classification Search
 CPC ... H01L 21/6838; B23Q 3/088; B25B 11/005; Y10T 279/11
 USPC ............................................ 269/21; 451/388
 See application file for complete search history.

(56) References Cited

U.S. PATENT DOCUMENTS

| | | |
|---|---|---|
| 4,667,944 A | 5/1987 | Althouse |
| 4,711,014 A | 12/1987 | Althouse |
| 4,856,766 A | 8/1989 | Huberts |
| 4,971,196 A | 11/1990 | Kitamura et al. |
| 5,324,012 A * | 6/1994 | Aoyama ............... B25B 11/005 269/21 |
| 5,883,778 A | 3/1999 | Sherstinsky et al. |
| 6,024,631 A * | 2/2000 | Piper ...................... B24B 37/30 125/12 |
| 6,513,306 B1 | 2/2003 | Milano |
| 6,541,989 B1 | 4/2003 | Norris et al. |
| 7,632,374 B2 | 12/2009 | Ozono et al. |
| 8,500,182 B2 | 8/2013 | Yang et al. |

(Continued)

FOREIGN PATENT DOCUMENTS

| | | |
|---|---|---|
| WO | 2011084531 A2 | 7/2011 |
| WO | 2011100204 A2 | 8/2011 |
| WO | 2013175166 A1 | 11/2013 |

*Primary Examiner* — Monica S Carter
*Assistant Examiner* — Mahdi H Nejad
(74) *Attorney, Agent, or Firm* — Viering, Jentschura & Partner mbB

(57) ABSTRACT

According to various embodiments, a substrate carrier may include: a substrate-supporting region for supporting a substrate; wherein a first portion of the substrate-supporting region including a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; wherein the pore network includes a first pore characteristic in a first region and a second pore characteristic in a second region different from the first pore characteristic.

19 Claims, 12 Drawing Sheets

(56) References Cited

U.S. PATENT DOCUMENTS

| | | | |
|---|---|---|---|
| 9,227,261 B2* | 1/2016 | Khanna | B23K 3/087 |
| 2008/0308223 A1 | 12/2008 | Sakairi et al. | |
| 2010/0200545 A1* | 8/2010 | Koelmel | C23C 16/4584 |
| | | | 216/58 |
| 2011/0198817 A1* | 8/2011 | Hurley | H01L 21/67092 |
| | | | 279/3 |
| 2013/0140838 A1 | 6/2013 | Wang et al. | |
| 2013/0264780 A1* | 10/2013 | Iwashita | H01L 21/6838 |
| | | | 279/3 |
| 2014/0189998 A1* | 7/2014 | Kusunose | H01L 21/6838 |
| | | | 29/559 |
| 2014/0302755 A1* | 10/2014 | Kumamoto | H01L 21/6838 |
| | | | 451/388 |

* cited by examiner

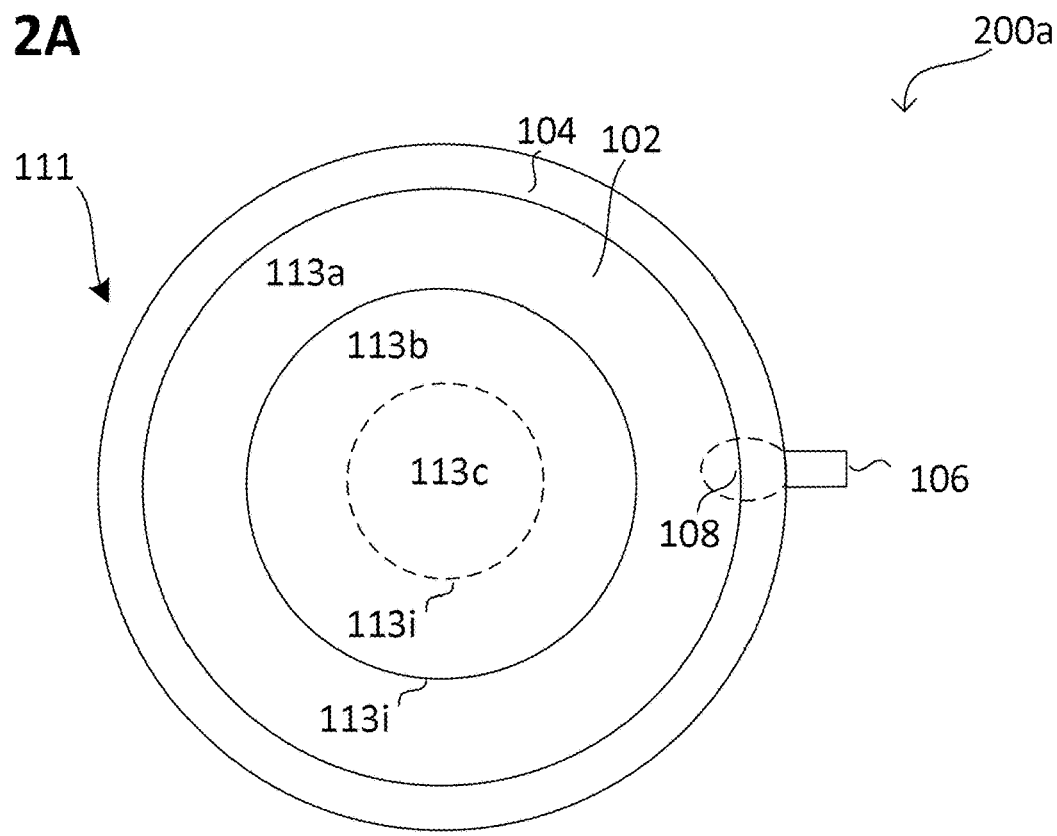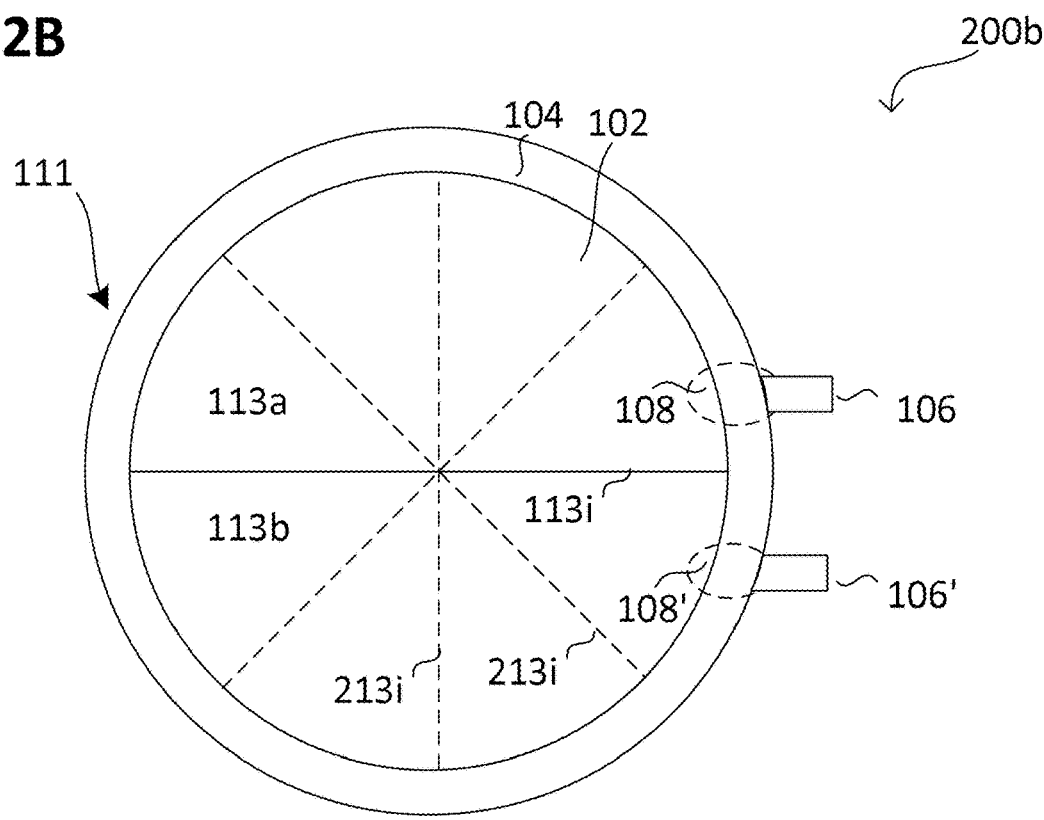

SUBSTRATE CARRIER, A PROCESSING ARRANGEMENT AND A METHOD

TECHNICAL FIELD

Various embodiments relate generally to a substrate carrier, a processing arrangement and a method.

BACKGROUND

In general, substrates (e.g. a wafer) may be processed while being attached to a substrate carrier. Conventionally, the substrate is adhered to the substrate carrier using an adhesive, e.g. a polymer adhesive. This may result in residual adhesive after the substrate is released from the substrate carrier which may impair further process steps, e.g. depositing one or more layers on the substrate. For example, the residual adhesive may impair the adhesion of layers to the substrate, resulting in partially released or weakly attached layers on the substrate.

Additionally, the adhesives may degas, e.g. when the substrate is processed in low pressure or high temperature, wherein these degassing products may contaminate the processing atmosphere, e.g. resulting in process faults. For example, the degassing products may impair the deposition and growth of layers and may cause growth defects. For example, the degassing products may impair the adhesion of layers to the substrate, resulting in partially released or weakly attached layers on the substrate.

SUMMARY

According to various embodiments, a substrate carrier may include: a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; wherein the pore network includes a first pore characteristic in a first region and a second pore characteristic in a second region different from the first pore characteristic.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2A and FIG. 2B respectively show a substrate carrier according to various embodiments in a top view;

DESCRIPTION

Figure 1A:
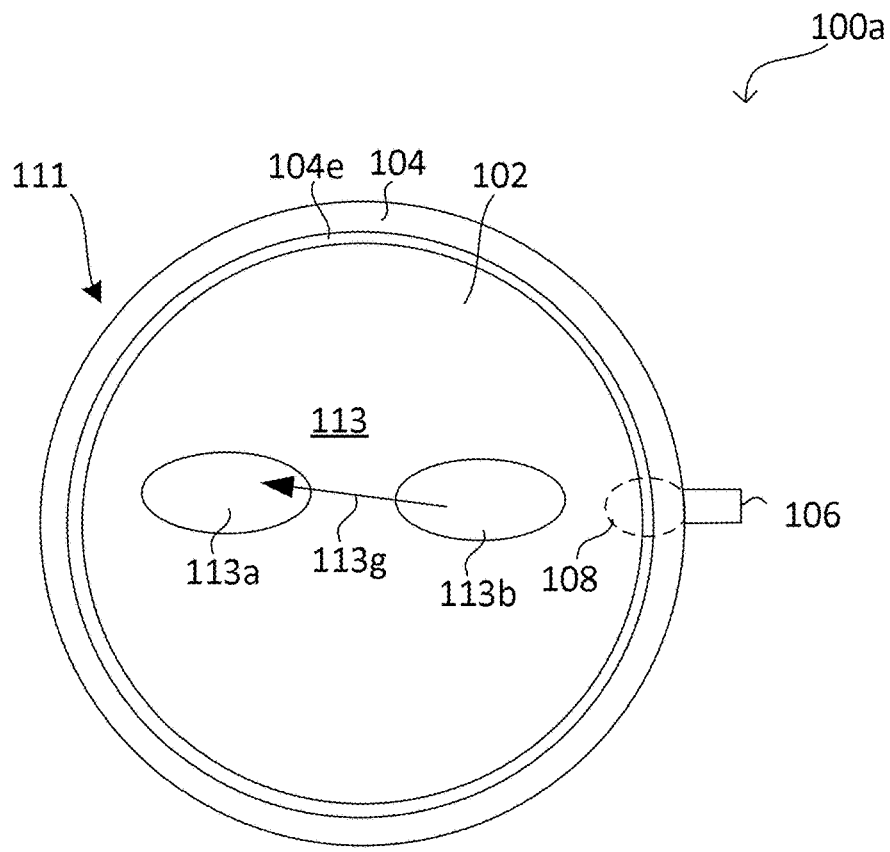
FIG. 1A shows a substrate carrier according to various embodiments in a top view.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

The phrase "at least one of" in regard to a group of elements may be used herein to mean at least one element from the group elements. For example, the phrase "at least one of" in regard to a group of elements may be used herein to mean a selection of: one of the listed elements, a plurality of one of the listed elements, a plurality of individual listed elements, or a plurality of a multiple of listed elements.

According to various embodiments, a substrate carrier is provided, which may adhere one or more substrates without using adhesives. This may result in improved process results and may simplify the process, e.g. accelerate the process.

According to various embodiments, a substrate carrier is provided which enables to adhere one or more substrates. Illustratively, the substrate carrier includes one or more regions, which can be evacuated and sealed separately, e.g. be separate valves. The one or more regions enable to adapt the suction distribution the needed requirements, e.g. to the size, shape and number of the one or more substrates. Alternatively or additionally, the substrate carrier includes an adaption layer which enables to adapt the suction distribution the needed requirements, e.g. to the size, shape and number of the one or more substrates. Alternatively or additionally, the pore characteristic of the substrate carrier provides a minimum flow resistance for fast evacuation of the substrate carrier and good supporting properties for the wafer.

According to various embodiments, a substrate carrier is provided, through which one or more substrates may be fixed to the substrate carrier using a vacuum as a mechanical component. The substrate carrier may provide a full-area support for the one or more substrates, such that locally bending of the one or more substrates may be avoided. This may reduce the risk to brake the one or more substrates and may alternatively or additionally, improve the process result, e.g. a surface of the one or more substrates may be focused more precisely, e.g. in photolithography.

FIG. 1A illustrates a substrate carrier 100a according to various embodiments in a top view, e.g. in a view direction on a substrate-supporting region 111 of the substrate carrier 100a. The substrate carrier 100a may include a first portion 102 of the substrate-supporting region 111 including a pore network 113 of at least partially interconnected pores. The substrate carrier 100a may include a second portion 104 of the substrate-supporting region 111. The second portion 104 of the substrate-supporting region 111 may surround the first portion and may include or be formed from a sealing member 104e for providing a contact sealing, e.g. in contact with a substrate.

According to various embodiments, the sealing member 104e may include or be formed from at least one of the following: an organic material (e.g. a polymer), or an inorganic material (e.g. a metal, a ceramic). According to various embodiments, the sealing member 104e, e.g. the polymer, may be stable, e.g. in its physical properties, up to temperatures (in other words, temperature stable) greater than about 250° C., e.g. greater than about 300° C., e.g. greater than about 350° C., e.g. greater than about 400° C. For example, the sealing member 104e, e.g. the polymer, may include a at least one of a melting temperature, a glass transition temperature (e.g. in the case of a polymer) or a decomposition temperature greater than about 250° C., e.g. greater than about 300° C., e.g. greater than about 350° C., e.g. greater than about 400° C., e.g. greater than about 450° C., e.g. greater than about 500° C., e.g. greater than about 600° C., e.g. lower than 1000° C. According to various embodiments, the sealing member 104e, e.g. the polymer, may be configured to be temperature stable for a time period (in other words, time stable) greater than about 10 minutes, e.g. greater than about 20 minutes, e.g. greater than about 30 minutes, e.g. greater than about 1 hour, e.g. greater than about 2 hours, e.g. greater than about 5 hours.

According to various embodiments, at least one of the first portion 102, or the second portion 104 may include or be formed from at least one of the following: organic material (e.g. a polymer), an inorganic material (e.g. a metal, a ceramic). According to various embodiments, at least one of the first portion 102, or the second portion 104, e.g. the polymer, may be temperature stable up to temperatures greater than about 250° C., e.g. greater than about 300° C., e.g. greater than about 350° C., e.g. greater than about 400° C. For example, at least one of the first portion 102, or the second portion 104, e.g. the polymer, may include at least one of a melting temperature (in other words, may include or be formed from a material having a melting temperature), a glass transition temperature (e.g. in the case of a polymer), or a decomposition temperature of greater than about 250° C., e.g. greater than about 300° C., e.g. greater than about 350° C., e.g. greater than about 400° C., e.g. greater than about 450° C., e.g. greater than about 500° C., e.g. greater than about 600° C., e.g. lower than 1000° C. According to various embodiments, at least one of the first portion 102, or the second portion 104, e.g. the polymer, may be configured to be temperature stable for a time period (in other words, time stable) greater than about 10 minutes, e.g. greater than about 20 minutes, e.g. greater than about 30 minutes, e.g. greater than about 1 hour, e.g. greater than about 2 hours, e.g. greater than about 5 hours.

Further, the substrate carrier 100a may include at least one evacuation port 106 for creating a vacuum in the pore network 113. The pore network 113 may be configured such that a substrate received over the substrate-supporting region 111 is adhered by suction if the pore network 113 is pumped out (in other words, if a vacuum is created in the pore network 113). Further, the substrate carrier 100a may include at least one valve 108 configured to control a connection between the pore network 113 and the at least one evacuation port 106. The at least one valve 108 may be hidden in this view (illustrated dashed).

In a closed-configuration of the at least one valve 108, the pore network 113 may be disconnected from the at least one evacuation port 106. In an opened-configuration of the at least one valve 108, the pore network 113 may be connected with the at least one evacuation port 106. The at least one valve 108 may be configured to be switched between the opened-configuration and the closed-configuration. In other words, the at least one valve 108 is configured to control the connection between the pore network 113 and the at least one evacuation port 106.

In an opened-configuration of the at least one valve 108, a vacuum may be created in the pore network 113 (in other words, the pore network 113 may be evacuated). Alternatively, in an opened-configuration of the at least one valve 108, the pore network 113 may be vented, e.g. filled with air. Creating a vacuum in the pore network 113 may include reducing a pressure in the pore network 113. Venting the pore network 113 may include increasing the pressure in the pore network 113. Venting the pore network 113 may enable to release a substrate from the substrate carrier 100a.

In a closed-configuration of the at least one valve 108, a vacuum may be maintained in the pore network 113. In other words, a pressure in the pore network 113 may be maintained, e.g. being substantially constant.

According to various embodiments, the substrate carrier 100a includes a first region 113a and a second region 113b.

According to various embodiments, the substrate carrier 100a includes a first pore characteristic in the first region 113a and a second pore characteristic in the second region 113b different from the first pore characteristic. Alternatively or additionally, the substrate carrier 100a includes a first pore network in the first region 113a and a second pore network (also referred to as further pore network) in the second region 113b separated from the first pore network (also referred to as pore network). Illustratively, the substrate carrier 100a may include one pore network 113 of at least partially interconnected pores extending over the first region 113a and the second region 113b or the substrate carrier 100a may include more than one pore network 113, each pore network of the more than one pore network 113 may be provided in a region of the substrate carrier 100a, e.g. the first region 113a and the second region 113b.

For example, the pore network 113 includes a first pore characteristic in the first region 113a and a second pore characteristic in the second region 113b different from the first pore characteristic. The pore characteristic may include at least one of the following: a spatial pore-density; a spatial pore-size; or a porosity. In other words, the pore characteristic may include a spatial pore-density, a spatial pore-size and/or a porosity.

According to various embodiments, a pore-density may refer to a number of pores per area or per volume. According to various embodiments, a spatial pore-size may refer to a spatial pore volume or a spatial pore expansion (extension), e.g. a spatial pore diameter. According to various embodiments, at least one of the spatial pore-size or the pore-density may refer to an averaged value, e.g. averaged over a region, e.g. at least one of: the first region 113a, or the second region 113b. According to various embodiments, a porosity (also referred to as void fraction) may refer to void space in a region, and may be understood as a fraction of the volume of voids over the total volume or total area of the region. The porosity may include a value in the range from 0.001 to 1, or in other words, as a percentage in the range from 0.1% to 100%. According to various embodiments, the porosity may refer to an averaged value, e.g. averaged over a region, e.g. at least one of the first region 113a; or the second region 113b. According to various embodiments, the pore-density and the spatial pore-size may define the porosity. Alternatively or additionally, the pore-density and the porosity may define the spatial pore-size. Alternatively or additionally, the porosity and the spatial pore-size may define the pore-density.

According to various embodiments, the pore characteristic of the first region 113a may be different from the pore characteristic of the second region 113b, in at least one the following: a spatial pore-density; a spatial pore-size; or a porosity. For example, a pore characteristic of the first region 113a (first pore characteristic) may include a value greater than the respective pore characteristic of the second region 113b (second pore characteristic), e.g. in at least one of the following: the spatial pore-density; the spatial pore-size; or the porosity.

According to various embodiments, the first region 113a and the second region 113b may include a distance between each other. Alternatively, the first region 113a and the second region 113b may be adjacent to each other. According to various embodiments, the first region 113a may surround the second region 113b.

According to various embodiments, the pore network includes a gradient 113g in at least one pore characteristic (pore characteristic gradient 113g), e.g. in at least one of the following: the spatial pore-density; the spatial pore-size; or the porosity. The pore characteristic gradient may define a gradient direction pointing into the direction of the maximum gradient. Illustratively, the gradient is in a direction of the greatest rate of spatial increase of the pore characteristic, e.g. of at least one of the following: the spatial pore-density; the spatial pore-size; or the porosity.

FIG. 1B to FIG. 1E respectively illustrate a substrate carrier 100a to 100e according to various embodiments in a cross sectional view (e.g. viewed along a surface 111s of the substrate receiving region 111).

Figure 1B:
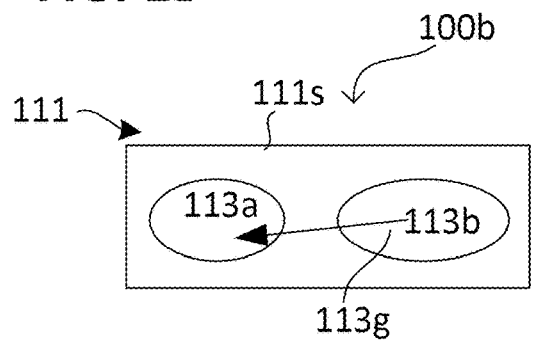
FIG. 1B to FIG. 1E respectively show a substrate carrier according to various embodiments in a cross sectional view.
Figure 1C:
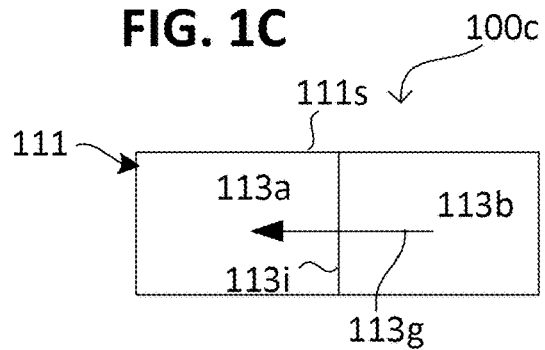
Figure 1D:
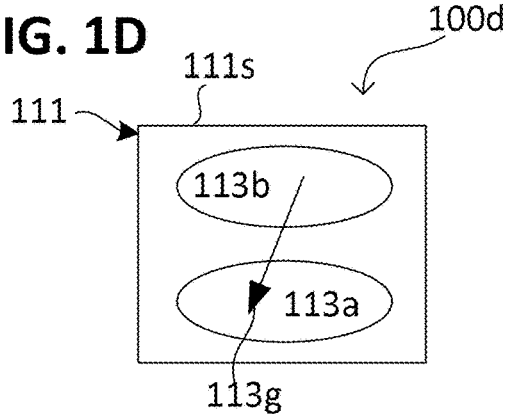
Figure 1E:
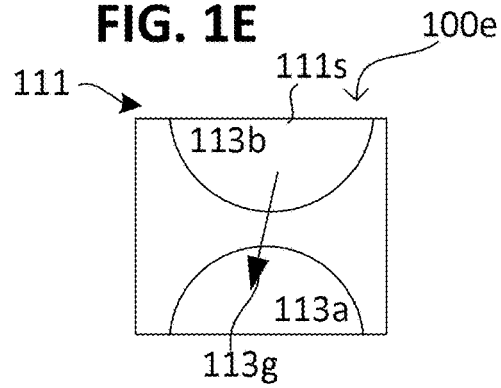

According to various embodiments, the second region 113b and the first region 113a may include a distance between each other, as illustrated in FIG. 1B. Alternatively, the second region 113b and the first region 113a may be in physical contact to each other (in other words, they may include an interface 113i), as illustrated in FIG. 1C. Optionally, the second region 113b may be disposed (e.g. at least partially) over the first region 113a, as illustrated in FIG. 1D and FIG. 1E. For example, at least a portion of an interface 113i between the first region 113a and the second region 113b may extend (in other words, at least sectionally) along a lateral direction (perpendicular to a vertical direction). Alternatively or additionally, the first region 113a and the second region 113b may be disposed or formed (e.g. at least partially) laterally next to each other, as illustrated in FIG. 1B. For example, at least a portion of an interface 113i between the first region 113a and the second region 113b may extend (in other words, at least sectionally) along the vertical direction, as illustrated in FIG. 1C.

According to various embodiments, the first pore characteristic may be spatially substantially constant within the first region 113a. Alternatively or additionally, the second pore characteristic may be spatially substantially constant within the second region 113b. In other words, at least one of the first region 113a or the second region 113b (in other words, at least one of the first region 113a, the second region 113b) may include or be formed from a homogeneous pore characteristic.

According to various embodiments, at least one of the first region 113a, or the second region 113b may include at least a portion of the surface 111s of the substrate receiving region 111. For example, the first region 113a and the second region 113b may include at least a portion of the surface 111s of the substrate receiving region 111, as illustrated in FIG. 1C. Alternatively, only the second region 113b may include at least a portion of the surface 111s of the substrate receiving region 111, as illustrated in FIG. 1C.

The surface 111s of the substrate receiving region 111 (at least in the first portion 102) may include pores of the pore network 113, which are opened.

The gradient direction of the pore characteristic gradient 113g may include a vertical direction component and a lateral direction component, as illustrated in FIG. 1B and FIG. 1D. Alternatively, the gradient direction may include exclusively the vertical direction component, as illustrated in FIG. 1C. Alternatively, the gradient direction may include exclusively the lateral direction component, as illustrated in FIG. 1E. For example, the gradient direction of the pore characteristic gradient 113g may be in a direction away from the surface 111s of the substrate receiving region 111.

The pore characteristic gradient 113g may extend at least partially between the first region 113a and the second region 113b. Alternatively or additionally, the pore characteristic gradient 113g may extend at least partially into at least one of the first region 113a, or the second region 113b. Alternatively or additionally, the pore characteristic gradient 113g may extend at least substantially through at least one of the first region 113a, or the second region 113b.

According to various embodiments, the pore characteristic may proximate the surface 111s of the substrate receiving region 111 being less than a pore characteristic distant from the surface 111s of the substrate receiving region 111, e.g. proximate to the at least one valve 108. For example, the pore characteristic gradient 113g may direct into a direction away from the surface 111s of the substrate receiving region 111. Alternatively or additionally, the pore characteristic gradient 113g may direct into a direction into the at least one valve 108.

The larger the pore characteristic of a region (e.g. a pore network provided therein) is the larger the permeability of the region (e.g. the pore network provided therein) is.

FIG. 2A illustrates a substrate carrier 200a according to various embodiments in a top view. According to various embodiments, the first region 113a may surround the second region 113b. Optionally, the substrate carrier 200a may include at least one further region of the pore network 113 having a further pore characteristic, e.g. different from at least one of the first pore characteristic, or the second pore characteristic. The second region 113b may surround the further region 113c (third region 113c).

FIG. 2B illustrates a substrate carrier 200b according to various embodiments in a top view. According to various embodiments, at least one of the first region 113a or the second region 113b may include a sector of the substrate receiving region 111, e.g. of the first portion 102. The sector may be understood as a portion of the substrate receiving region 111, e.g. of the first portion 102a, enclosed by an arc (e.g. a half sector or a quarter sector).

Alternatively, at least one of the first region 113a or the second region 113b may include a segment of the substrate receiving region 111, e.g. of the first portion 102.

For example, at least one of the first region 113a or the second region 113b may include a circular sector of the substrate receiving region 111, e.g. of the first portion. The sectors may adjoin each other in an interface 113i, e.g. the interface 113i being linear. Optionally, the substrate carrier 200b may include one or more further interfaces 213, dividing the first portion 102 into more than two regions of the pore network 113.

According to various embodiments, the substrate carrier 200b may include a plurality of pore networks (e.g. in a plurality of regions 113a, 113b). In other words, each pore networks of the plurality of pore networks may be provided in one region of the plurality of regions 113a, 113b. The plurality of pore networks may be separated from each other, e.g. at least spatially. Illustratively, the separated pore networks may enable to adhere substrates different in at least one of size or shape.

According to various embodiments, the at least one valve may include a plurality of valves, e.g. two valves 108, 108' as illustrated in FIG. 2B. Alternatively or additionally, the at least one evacuation port may include a plurality of evacuation ports, e.g. two evacuation ports 106, 106' as illustrated in FIG. 2B. Each valve of the plurality of valves may be configured to control a connection between one pore network of the plurality of pore networks and one evacuation port of the plurality of evacuation ports. Alternatively or additionally, each valve of the plurality of valves may be configured to control a connection between one region of the plurality of regions 113a, 113b and one evacuation port of the plurality of evacuation ports 106, 106'. For example, each region of the plurality of regions 113a, 113b (e.g. the pore network provided therein) may be connectable to one evacuation port of the plurality of evacuation ports 106, 106' by one valve of the plurality of valves 108, 108'. Optionally, each region of the plurality of regions 113a, 113b (e.g. the pore network provided therein) may be connectable to more than one evacuation port of the plurality of evacuation ports 106, 106' by one or more than one valve of the plurality of valves 108, 108'.

Optionally, the substrate carrier 200b may include one or more discontinuations in the pore network 113 (in other words, at least one region in the first portion 102 which is free of pores). Alternatively or additionally, the plurality of regions 113a, 113b may formed with a symmetry, e.g. at least one of: arc symmetry, radial symmetry, or axial symmetry. Alternatively or additionally, each region of the plurality of regions 113a, 113b may be connected separately to at least one of: one valve; or one evacuation port.

Figure 3A:
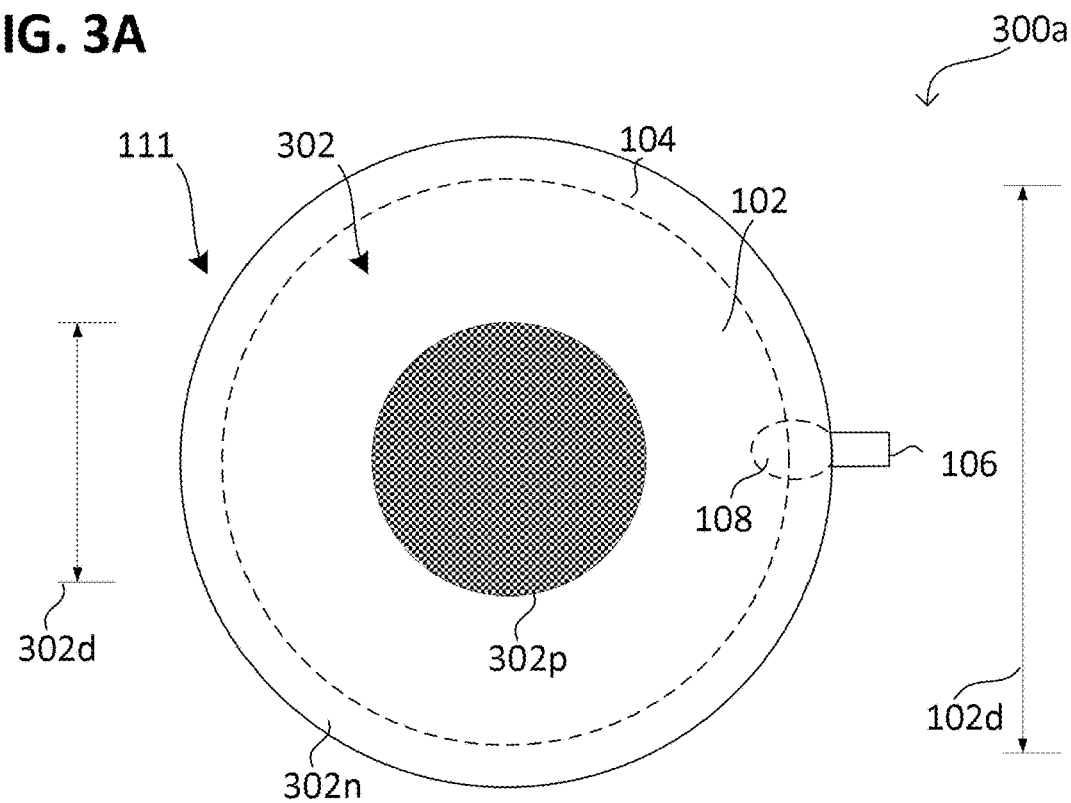
FIG. 3A shows a substrate carrier according to various embodiments in a top view.

FIG. 3A illustrates a substrate carrier 300a according to various embodiments in a top view, wherein the substrate carrier 300a may include an adaption layer 302. The adaption layer 302 may cover the first portion 102 completely and the second portion 104 at least partially. The first portion 102 and the second portion 104 may be hidden in this view by the adaption layer 302 (illustrated by dashed lines).

The adaption layer 302 may include a permeable portion 302p having an extension 302d which is less than an extension 102d of the first portion 102. Further, the adaption layer 302 may include a non-permeable portion 302n having an extension 302d which is greater than the extension 102d of the first portion 102. The non-permeable portion 302n may be disposed partially over the first portion 102 and at least partially over the second portion 104. In other words, the non-permeable portion 302n may cover the first portion 102 partially (a fraction of the first portion 102) and the second portion at least partially (e.g. partially or completely). The permeable portion 302p may be disposed partially over the first portion 102. The permeable portion 302p may cover a fraction of the first portion 102, e.g. in the range from about 10% to about 90%, e.g. in the range from about 10% to about 75%, e.g. in the range from about 10% to about 50% or in the range from about 50% to about 90%. The adaption layer 302 may provide an adaption of a spatial suction distribution.

Illustratively, the adaption layer 302 may provide a spatial suction force (also referred to as spatial adhesion force) in the permeable portion 302p being greater than a spatial suction force in the non-permeable portion 302n. For example, the spatial suction force in the non-permeable portion 302n may be substantially zero. This enables to adapt the spatial suction distribution to smaller substrates, e.g. substrates smaller than the extension 102d of the first portion 102 without braking the vacuum in the pore network 113. Illustratively, the adaption layer 302 may enable to seal the portions of the substrate receiving region 111, which are not covered by the substrate. For example, the adaption layer 302 may provide to adhere an 8 inch substrate to a 12 inch substrate carrier 300a by suction.

According to various embodiments, the permeable portion 302p is be configured to allow gas to pass through the adaption layer 302 in the permeable portion 302p (also referred to as permeation or imbuing). Illustratively, the permeable portion 302p may be gas conductive (gas permeable or pervious to gas), so as to connect to pore network with a surface of the permeable portion 302p opposite the pore network.

According to various embodiments, a permeability (permeability coefficient) of the permeable portion 302p may be greater than a permeability of the non-permeable portion 302n. The permeability may be understood as a value describing how much volume of a gas (referred to a temperature of the gas of 0° C. and 1 bar gas pressure) passes (flow) through a region or portion per time (flow rate). In other words, the permeability describes a gas flow through the region or portion, along a flow direction. The permeability may be referred to an area of the region or portion perpendicular to the flow direction, to the partial pressure difference of the gas along the direction of the gas flow and may be normalized to a thickness of the region or portion along the direction of the gas flow.

The permeability of the permeable portion 302p may be greater than about $10^{-15}$ $m^2$ $s^{-1}$, e.g. greater than about $10^{-10}$ $m^2$ $s^1$, e.g. greater than about $10^{-5}$ $m^2$ $s^{-1}$. The permeability of the non-permeable portion 302n may be less than about $10^{-15}$ $m^2$ $s^{-1}$, e.g. greater than about $10^{-16}$ $m^2$ $s^{-1}$, e.g. greater than about $10^{-17}$ $m^2$ $s^{-1}$.

The permeable portion 302p may include a circular shape. Alternatively, the permeable portion 302p may include other shapes, e.g. a square shape or another polygonal shape, an elliptical shape, etc.

According to various embodiments, the adaption layer 302 may include or be formed from at least one of the following an organic material (e.g. a polymer), or an inorganic material (e.g. a metal, a ceramic). Optionally, the adaption layer 302 may include or be formed from a foil, e.g. a metal foil or a polymer foil. For example, the adaption layer 302, e.g. the polymer, may be temperature stable up to temperatures greater than about 250° C., e.g. greater than about 300° C., e.g. greater than about 350° C., e.g. greater than about 400° C. For example, the adaption layer 302, e.g. the polymer, includes at least one of a melting temperature, a glass transition temperature (e.g. in the case of a polymer), or a decomposition temperature of greater than about 250° C., e.g. greater than about 300° C., e.g. greater than about 350° C., e.g. greater than about 400° C., e.g. greater than about 450° C., e.g. greater than about 500° C., e.g. greater than about 600° C., e.g. lower than 1000° C. According to various embodiments, the adaption layer 302, e.g. the polymer, may be configured to be temperature stable for a time period (in other words, time stable) greater than about 10 minutes, e.g. greater than about 20 minutes, e.g. greater than about 30 minutes, e.g. greater than about 1 hour, e.g. greater than about 2 hours, e.g. greater than about 5 hours.

Figure 3B:
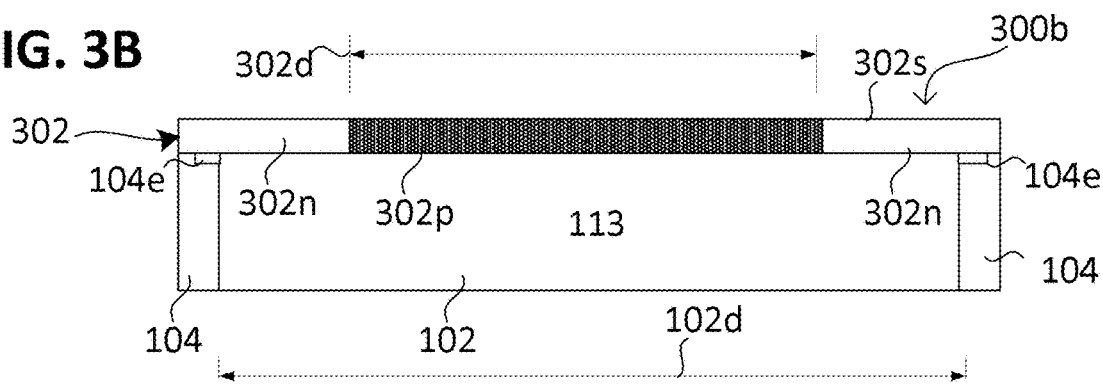
FIG. 3B and FIG. 3C respectively show a substrate carrier according to various embodiments in a cross sectional view.

FIG. 3B illustrates a substrate carrier 300b according to various embodiments in a cross sectional view, e.g. the substrate carrier 300a. The permeable portion 302p may extend through the adaption layer 302 and connect the pore network 113 with a surface 302s of the adaption layer 302 opposite the pore network 113.

The permeable portion 302p may be disposed distant to the second portion 104, e.g. distant to the sealing member 104e. The non-permeable portion 302n may be in physical contact with the second portion 104, e.g. in physical contact with the sealing member 104e.

Figure 3C:
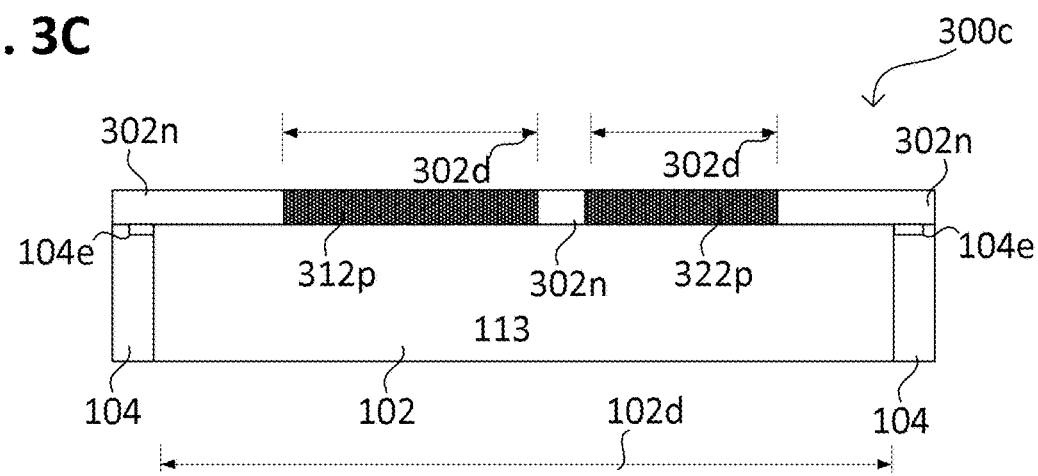

FIG. 3C illustrates a substrate carrier 300c according to various embodiments in a cross sectional view, e.g. the substrate carrier 300a. The adaption layer 302 may include more than one permeable portion 302p, e.g. a first permeable portion 312p and a second permeable portion 322p. The first permeable portion 312p may differ from the second permeable portion 322p in at least one of the following: an extension 302d (e.g. diameter), a cross section area, or a permeability.

According to various embodiments, a permeability (permeability coefficient) of the first permeable portion 312p may be greater than a permeability of the non-permeable portion 302n. According to various embodiments, a permeability (permeability coefficient) of the second permeable portion 322p may be greater than a permeability of the non-permeable portion 302n. The non-permeable portion 302n may surround both, the first permeable portion 312p and the second permeable portion 322p. The first permeable portion 312p and the second permeable portion 322p may be disposed distant to the second portion 104.

Figure 4A:
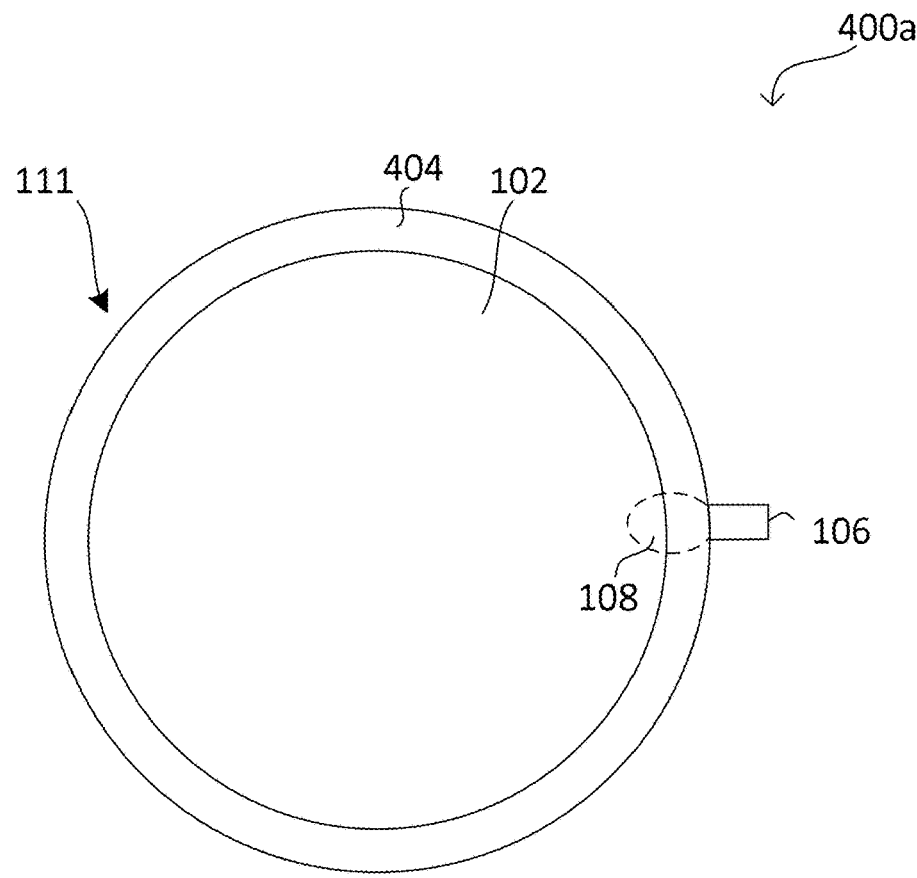
FIG. 4A shows a substrate carrier according to various embodiments in a top view.

FIG. 4A illustrates a substrate carrier 400a according to various embodiments in a top view, wherein the second portion 104 of the substrate-supporting region 111 surrounds the first portion 102 and includes an elastomer 404 for providing a contact sealing. For example, the sealing member 104e may include or be formed from the elastomer 404. The elastomer 404 may include or be formed from an elastomeric polymer. According to various embodiments, the elastomer 404 may surround the first portion 102.

Figure 4B:
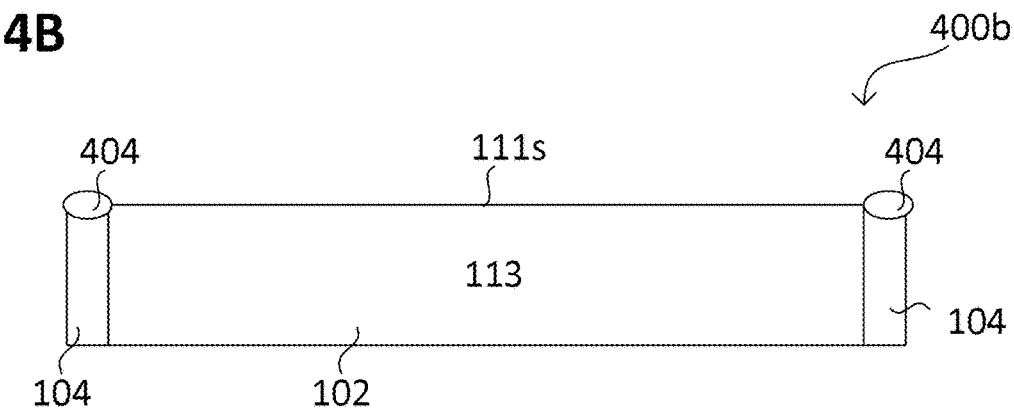
FIG. 4B and FIG. 4C respectively show a substrate carrier according to various embodiments in a cross sectional view.
Figure 4C:
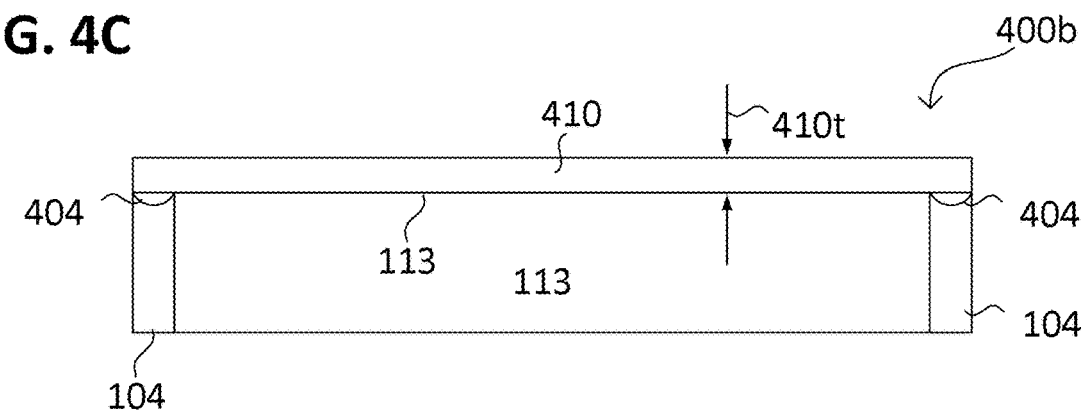

FIG. 4B and FIG. 4C respectively illustrate a substrate carrier 400b according to various embodiments in a cross sectional view, e.g. the substrate carrier 400a. The elastomer 404 may protrude with respect to the surface 111s of the substrate receiving region 111 at least in the first portion 102. Illustratively, the elastomer 404 may be compressible, such that a substrate 410 may compress the elastomer 404 when being adhered to the substrate carrier 400b, such that the surface 111s of the substrate receiving region 111 may be at least substantially planar in the first portion 102 and in the second portion 104, as illustrated in FIG. 4C. The substrate adhered to the substrate carrier 400b may be in physical contact to the surface 111s of the substrate receiving region 111 in the first portion 102 and in the second portion 104.

According to various embodiments, at least substantially planar may be understood that a height variation of a region or surface, e.g. of the substrate receiving region 111, is less than or equal to a predetermined value, the predetermined value may less than or equal to about 150 μm, e.g. less than or equal to about 100 μm, e.g. less than or equal to about 50 μm, e.g. less than or equal to about 10 μm, e.g. less than or equal to about 5 μm, e.g. less than or equal to about 2 μm, e.g. less than or equal to about 1 μm, e.g. less than or equal to about 0.5 μm, e.g. less than or equal to about 0.2 μm, e.g. less than or equal to about 0.1 μm, e.g. substantially zero (in other words, planar), e.g. greater than about 0.01 μm, e.g. greater than about 0.05 μm. The height variation of a region or surface may be understood as spatially averaged height differences of the region or surface regarding a (planar) plane, wherein the plane is disposed in the region or surface in a position and orientation in which it includes the maximum elements (e.g. points) of the region or surface.

For example, at least substantially planar may be understood that a height difference between an upper surface of the first portion 102 (e.g. the sealing member, e.g. being a contact sealing), and an upper surface of the second portion 104 (e.g. a porous carrier if present) is less than or equal to about at least one of: a spatially averaged pore size of the second portion 104 (e.g. a porous carrier if present), a thickness of the substrate 410, or the predetermined value. At least substantially planar may be illustratively understood as being smoother than the thickness of the substrate to be processed.

According to various embodiments, the elastomer 404 may protrude with respect to the surface 111s of the substrate receiving region 111 at least in the first portion 102 by less than a thickness 410t of the substrate 410, e.g. less than half the thickness 410t of the substrate 410, e.g. less than 25% of the thickness 410t of the substrate 410, e.g. less than 10% of the thickness 410t of the substrate 410, e.g. less than 1% of the thickness 410t of the substrate 410. For example, the elastomer 404 may protrude with respect to the surface 111s of the substrate receiving region 111 at least in the first portion 102 by less than about 1 mm, e.g. less than about 0.1 mm, e.g. in the range from about 10 μm to about 1 mm.

Alternatively, the elastomer 404 may be formed such, that the surface 111s of the substrate receiving region 111 at least in the first portion 102 and the second portion 104 is at least substantially planar. For example, the sealing member 104e may be formed such, that the surface 111s of the substrate receiving region 111 at least in the first portion 102 and the second portion 104 is at least substantially planar. In this case, the sealing member 104e may include or be formed from a material other than the elastomer 404, e.g. at least one of the following: a polymer, e.g. a thermoplastic (also referred to as thermo-softening polymer), a metal, or a ceramic. For example, the sealing member 104e, e.g. the thermoplastic, may be temperature stable up to temperatures greater than about 250° C., e.g. greater than about 300° C., e.g. greater than about 350° C., e.g. greater than about 400° C. For example, the sealing member 104e, e.g. the thermoplastic, may include at least one of a melting temperature, a glass transition temperature (e.g. in the case of a polymer), or a decomposition temperature of greater than about 250° C., e.g. greater than about 300° C., e.g. greater than about 350° C., e.g. greater than about 400° C., e.g. greater than about 450° C., e.g. greater than about 500° C., e.g. greater than about 600° C., e.g. lower than 1000° C. According to various embodiments, the sealing member 104e, e.g. the thermoplastic, may be configured to be temperature stable for a time period (in other words, time stable) greater than about 10 minutes, e.g. greater than about 20 minutes, e.g. greater than about 30 minutes, e.g. greater than about 1 hour, e.g. greater than about 2 hours, e.g. greater than about 5 hours.

According to various embodiments, the sealing member 104e, e.g. the elastomer 404, may be temperature stable up to temperatures greater than about 250° C., e.g. greater than about 300° C., e.g. greater than about 350° C., e.g. greater than about 400° C. For example, the sealing member 104e, e.g. the elastomer 404, may include at least one of a melting temperature, a glass transition temperature (e.g. in the case of a polymer), or a decomposition temperature of greater than about 250° C., e.g. greater than about 300° C., e.g. greater than about 350° C., e.g. greater than about 400° C., e.g. greater than about 450° C., e.g. greater than about 500° C., e.g. greater than about 600° C., e.g. lower than 1000° C. According to various embodiments, the sealing member 104e, e.g. the elastomer 404, may be configured to be temperature stable for a time period (in other words, time stable) greater than about 10 minutes, e.g. greater than about 20 minutes, e.g. greater than about 30 minutes, e.g. greater than about 1 hour, e.g. greater than about 2 hours, e.g. greater than about 5 hours.

Figure 5A:
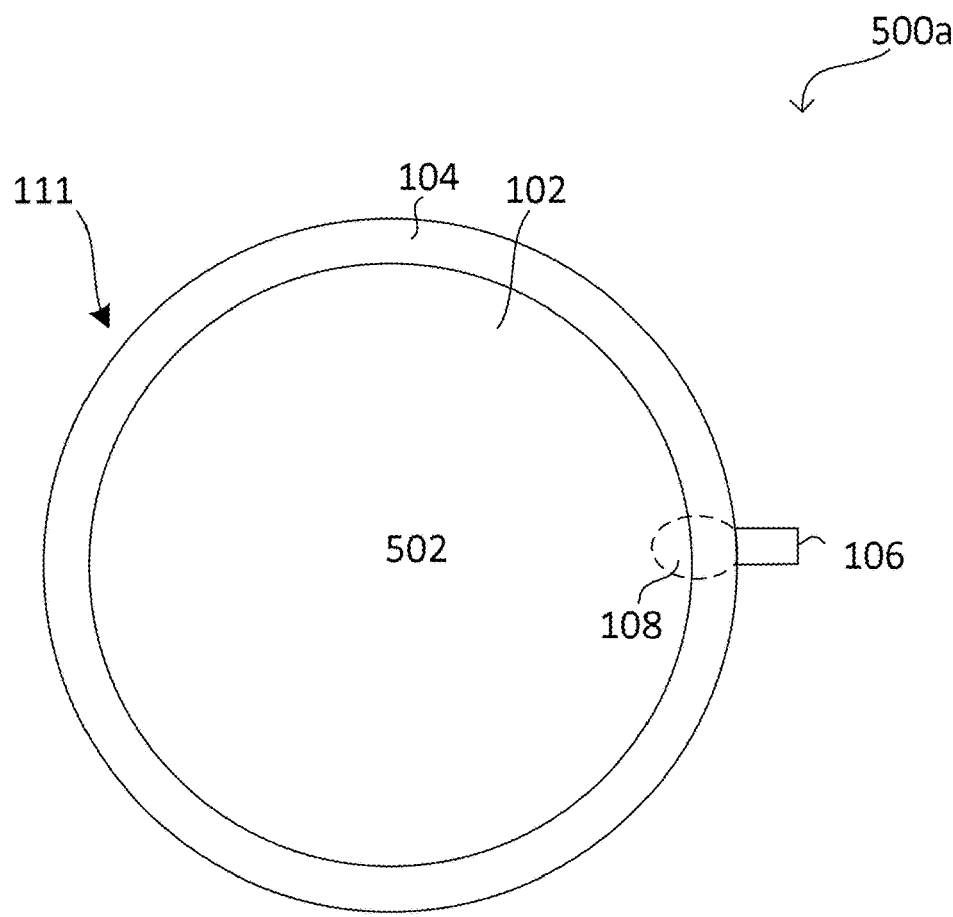
FIG. 5A shows a substrate carrier according to various embodiments in a top view.

FIG. 5A illustrates a substrate carrier 500a according to various embodiments in a top view. The substrate carrier 500a may include a recess 502, e.g. extending at least in the first portion 102. The recess 502 may be surrounded by the second portion 104. According to various embodiments, the recess 502 may be connected to the at least one valve 108. The at least one valve 108 may be configured to control the connection between the recess 502 and the at least one evacuation port 106 in analogy to the pore network 113, as described before.

Figure 5B:
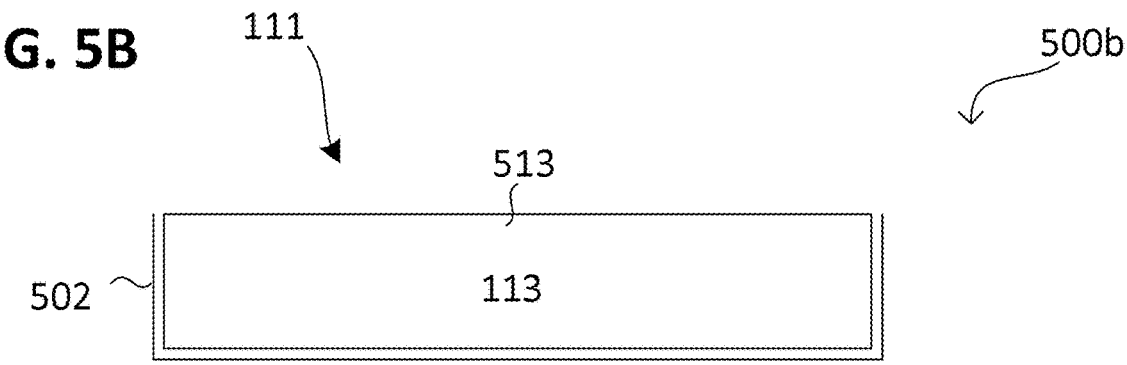
FIG. 5B and FIG. 5C respectively show a substrate carrier according to various embodiments in a cross sectional view.

FIG. 5B illustrates a substrate carrier 500b according to various embodiments in a cross sectional view, e.g. the substrate carrier 500b. The substrate carrier 500b may include a porous carrier 513 in which the pore network 113 is formed. In other words, the porous carrier 513 may include the pore network 113. The porous carrier 513 may be configured to fit into the recess 502, such that porous carrier 513 may be received in the recess 502.

According to various embodiments, the porous carrier 513 may be detachably received in the recess. This may enable to adapt the substrate carrier 500b to the needed requirements to the size, shape and number of the substrates.

Figure 5C:
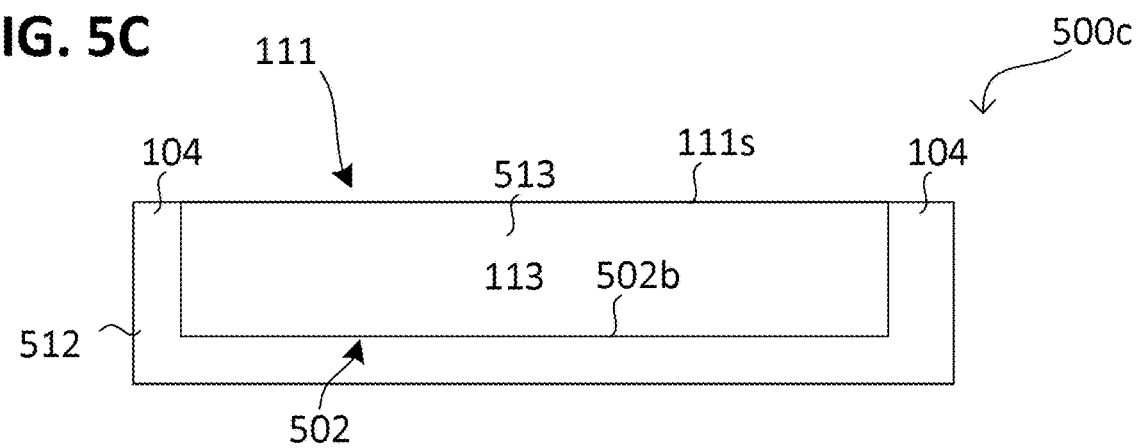

FIG. 5C illustrates a substrate carrier 500c according to various embodiments in a cross sectional view, e.g. the substrate carrier 500c. The substrate carrier 500c may include a carrier plate 512 in which the recess 502 is formed. The carrier plate 512 may include the second portion 104 surrounding the recess 502. For example, the carrier plate 512 may include at least one recess 502 in the first portion 102. The porous carrier 513 may be disposed in the recess 502, e.g. in physical contact with a bottom 502b of the recess 502 opposite the substrate-supporting region, e.g. opposite the surface 111s of the substrate receiving region 111.

According to various embodiments, the carrier plate 512 may include or be formed from at least one of the following: an organic material (e.g. a polymer), or an inorganic material (e.g. a metal, a ceramic). For example, the carrier plate 512, e.g. the polymer, may be temperature stable up to temperatures greater than about 250° C., e.g. greater than about 300° C., e.g. greater than about 350° C., e.g. greater than about 400° C. For example, the carrier plate 512, e.g. the polymer, include at least one of a melting temperature, or a glass transition temperature (e.g. in the case of a polymer), or a decomposition temperature of greater than about 250° C., e.g. greater than about 300° C., e.g. greater than about 350° C., e.g. greater than about 400° C., e.g. greater than about 450° C., e.g. greater than about 500° C., e.g. greater than about 600° C., e.g. lower than 1000° C. According to various embodiments, the se carrier plate 512, e.g. the polymer, may be configured to be temperature stable for a time period (in other words, time stable) greater than about 10 minutes, e.g. greater than about 20 minutes, e.g. greater than about 30 minutes, e.g. greater than about 1 hour, e.g. greater than about 2 hours, e.g. greater than about 5 hours.

Figure 6A:
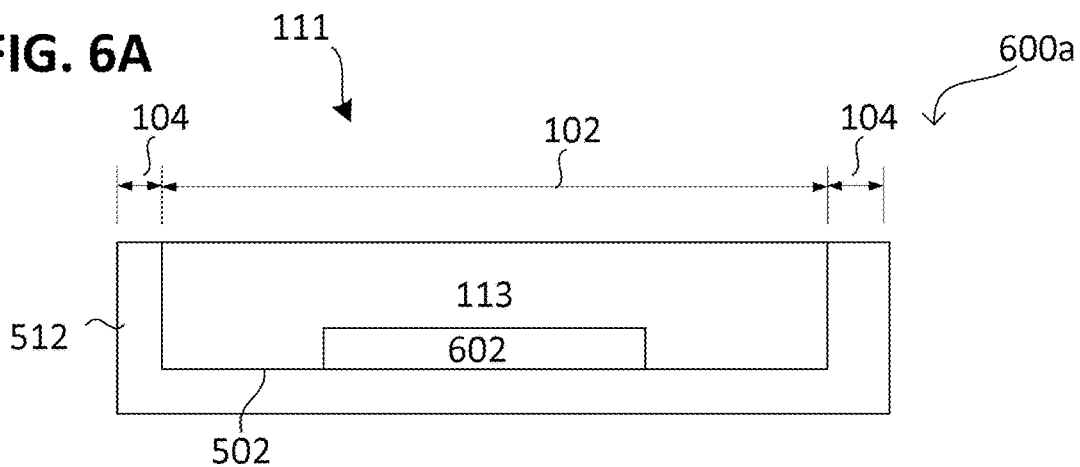
FIG. 6A to FIG. 6D respectively show a substrate carrier according to various embodiments in a cross sectional view.

FIG. 6A illustrates a substrate carrier 600a according to various embodiments in a cross sectional view, wherein the substrate carrier 600a may include a hollow reservoir 602 coupled with the pore network 113. Alternatively or additionally, the hollow reservoir 602 may be coupled with the at least one valve (not illustrated). The hollow reservoir 602 may be formed or extend in at least one of the following: the pore network 113, the first portion 102, or the second portion 104. Alternatively or additionally, the hollow reservoir 602 may be formed or extend in the recess 502, if the substrate carrier 600a includes the recess 502. Alternatively or additionally, the hollow reservoir 602 may be formed or extend in the carrier plate 512, if the substrate carrier 600a includes the carrier plate 512. Alternatively or additionally, the hollow reservoir 602 may be formed or extend in the porous carrier 513, if the substrate carrier 600a includes the porous carrier 513.

Figure 6B:
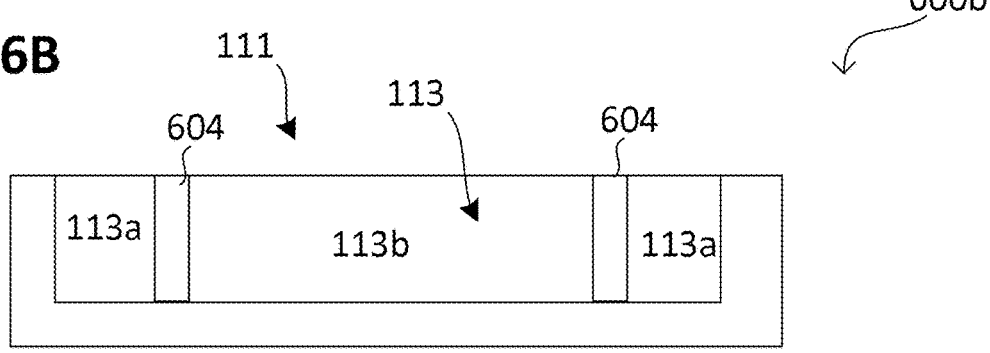

FIG. 6B illustrates a substrate carrier 600b according to various embodiments in a cross sectional view, wherein the substrate carrier 600b includes one or more separation walls 604. Further the substrate carrier 600b may include a plurality of regions 113a, 113b, e.g. at least one first region 113a and at least one second region 113b.

According to various embodiments, each region of the plurality of regions 113a, 113b may include a pore characteristic different from at least one other regions of the plurality of regions 113a, 113b, e.g. all other regions of the plurality of regions 113a, 113b.

The one or more separation walls 604 may be disposed between two regions of the plurality of regions 113a, 113b from each other. The one or more separation walls 604 may separate two regions of regions from each other. For example, the one or more separation walls 604 may separate the at least one first region 113a and at least one second region 113b from each other. For example, the one or more separation walls 604 may include at least one separating wall 604 surrounding the second region 113b.

Figure 6C:
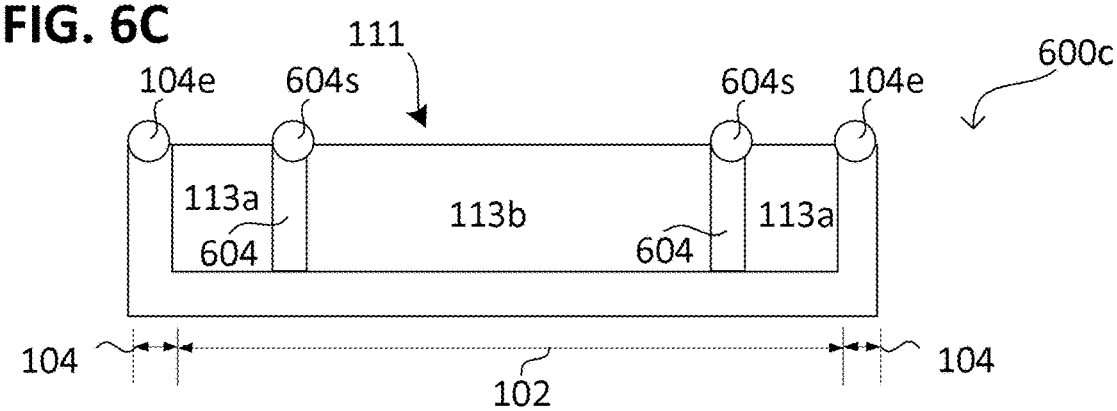

FIG. 6C illustrates a substrate carrier 600c according to various embodiments in a cross sectional view, wherein the substrate carrier 600c may include more than one sealing member. The first portion 102 may include a first sealing member 604s of the more than one sealing member, wherein the first sealing member 604s may be part of the one or more separation walls 604. The second portion 104 may include a second sealing member 104e of the more than one sealing member surrounding the first portion 102.

Optionally, at least one sealing member of the more than one sealing member may include an elastomer.

Figure 6D:
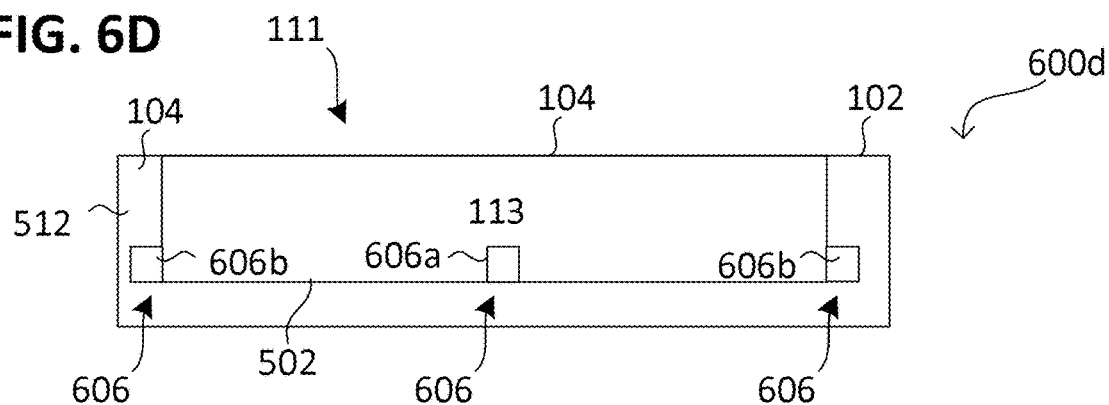

FIG. 6D illustrates a substrate carrier 600d according to various embodiments in a cross sectional view, wherein the substrate carrier 600d includes an evacuation line structure 606 coupling the pore network with the at least one evacuation port (not illustrated). Alternatively or additionally, the evacuation line structure 606 couples the pore network with the at least one valve (not illustrated).

The evacuation line structure 606 may include at least one of the following: an evacuation line 606a at least partially extending into the pore network 113, or an evacuation line 606b at least partially surrounding the pore network 113. Illustratively, the evacuation line structure 606 may facilitate creating a vacuum in the pore network 113, e.g. be reducing a flow resistance.

The evacuation line structure 606 may be formed or extend in at least one of the following: the pore network 113, the first portion 102, or the second portion 104. Alternatively or additionally, the evacuation line structure 606 may be formed or extend in the recess 502, if the substrate carrier 600d includes the recess 502. Alternatively or additionally, the evacuation line structure 606 may be formed or extend in the carrier plate 512, if the substrate carrier 600d includes the carrier plate 512. Alternatively or additionally, the evacuation line structure 606 may be formed or extend in the porous carrier 513, if the substrate carrier 600d includes the porous carrier 513.

Figure 7A:
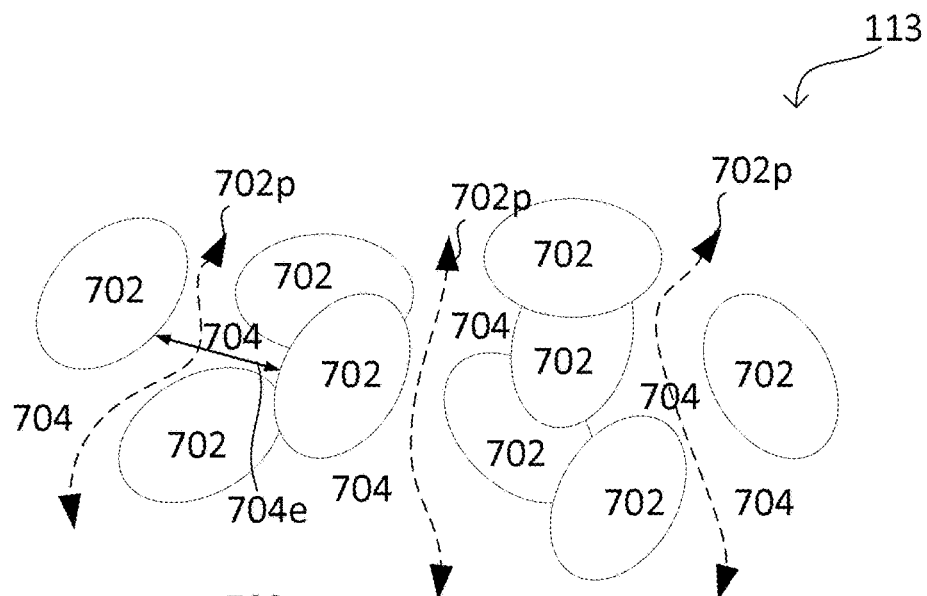
FIG. 7A to FIG. 7C respectively show a pore network according to various embodiments in a cross sectional view.

FIG. 7A illustrates a pore network 113 according to various embodiments in a cross sectional view, wherein the pore network 113 is formed in an aggregate of particles 702 (illustratively a package of particles). The pores 704 of the pore network 113 may be formed through the gaps at least one of in or between the particles 702 of the aggregate of particles. The particles 702 of the aggregate of particles may be in physical contact with each other, e.g. at least pairwise. The particles may be connected with each other, e.g. by sintering, e.g. at least pairwise. The pores 704 of the pore network 113 may be connected to each other, e.g. at least pairwise, therefore forming a plurality of paths 702p (illustratively channels), which extend through the pores 704 of the pore network 113. Along each path of the plurality of paths 702p, the pores 704 of the pore network 113 may be connected to each other (illustratively, forming a network). The paths of the plurality of paths 702p may at least one of the following: extend in randomly order; crossing each other; branch out; include loop portions; or contact each other (see also FIG. 7B and FIG. 7C).

The pore network 113 may include more than one path of the plurality of paths 702p extending from the at least one valve 108 to the substrate receiving region 111, e.g. the surface 111s of the substrate receiving region 111.

Figure 7B:
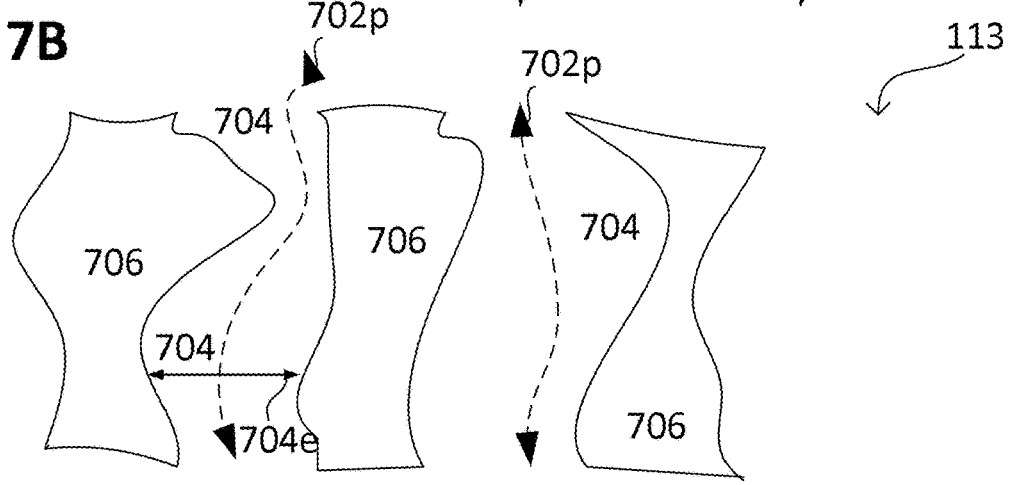

FIG. 7B illustrates a pore network 113 according to various embodiments in a cross sectional view, wherein the pore network 113 is formed in a partially eroded material 706. The partially eroded material 706 may include a plurality of pores 704, e.g. partially elongated pores, connected to each other (illustratively forming trenches extending through the partially eroded material 706). The partially eroded material 706 may be formed from a mixture of a first material and a second material, wherein the second material is removed from the mixture, e.g. washed out, thereby forming the plurality of pores 704.

Figure 7C:
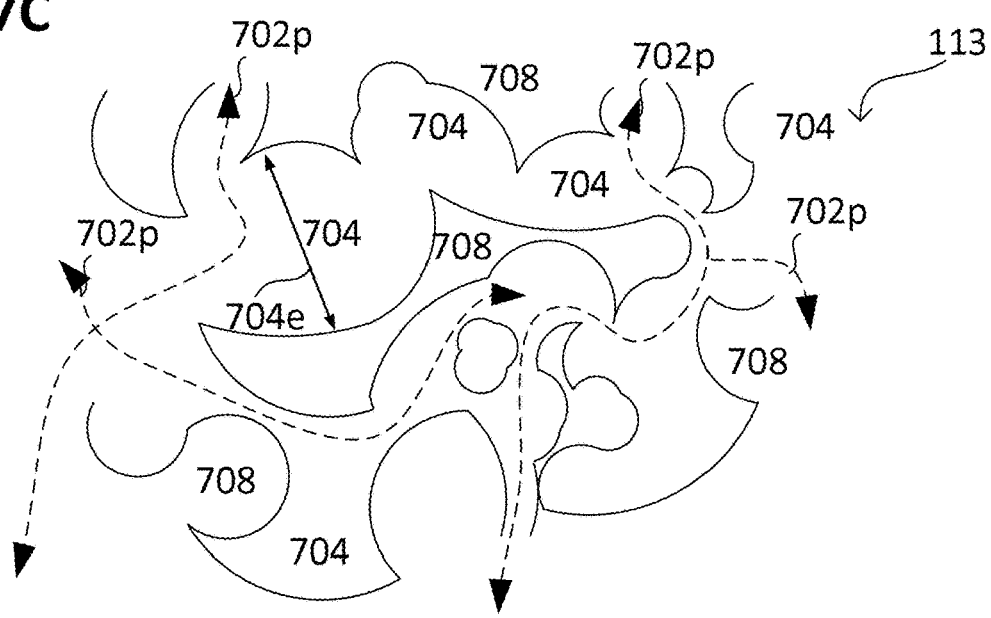

FIG. 7C illustrates a pore network 113 according to various embodiments in a cross sectional view, wherein the pore network 113 is formed in a solid foam 708. The solid foam 708 may include a plurality of pores 704. The solid foam 708 may be formed by adding gas into a material (e.g. a metal) in liquid form, e.g. from a mixture of a gas and the material in liquid form. After adding gas, the material may be solidified, e.g. by cooling down the material, wherein the regions including the gas form the plurality of pores 704.

According to various embodiments the pore network includes at least one of the following: micropores, in other words, pores 704 with an extension 704e (e.g. diameter) less than about 2 nm; mesopores, in other words, pores 704 with an extension 704e (e.g. diameter) in the range from about 2 nm to about 50 nm; or macropores in other words, pores 704 with an extension 704e (e.g. diameter) greater than about 50 nm.

Figure 8A:
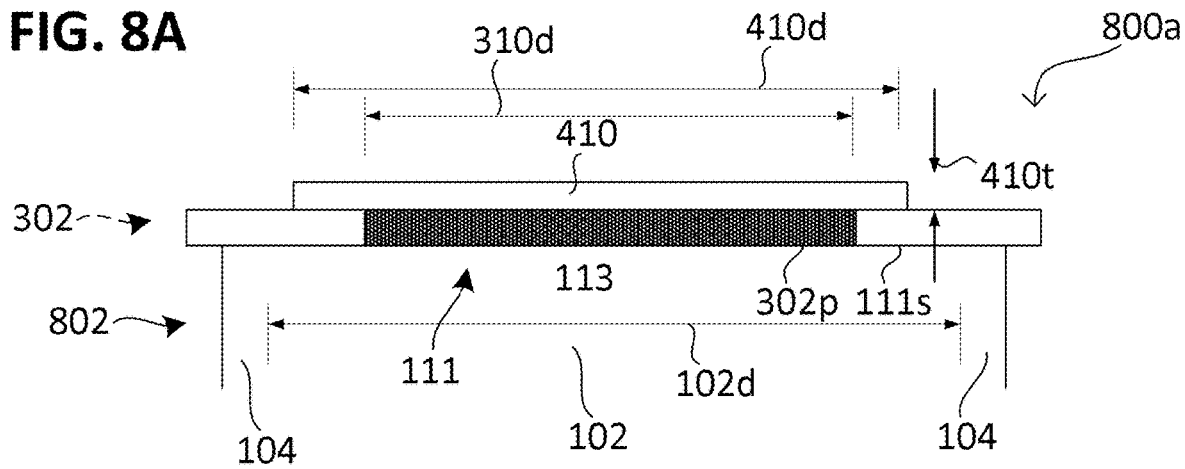
FIG. 8A to FIG. 8D respectively show a processing arrangement according to various embodiments in a cross sectional view.

FIG. 8A illustrates a processing arrangement 800a according to various embodiments in a cross sectional view. The processing arrangement 800a may include a substrate carrier 802 according to various embodiments, e.g. configured similar to at least one of the substrate carriers described before, e.g. similar to at least one of the following: the substrate carrier 100a, the substrate carrier 200a, the substrate carrier 400a, the substrate carrier 500a, or the substrate carrier 600a to 600d. The processing arrangement 800a may further include a substrate 410 disposed over the substrate-supporting region 111 of the substrate carrier 802.

A pore size of the substrate-supporting region 111, e.g. of the pore network 113, may be smaller than twice a thickness 410t of the substrate 410, e.g. smaller than about 25% of the thickness 410t of the substrate 410, e.g. smaller than about 10% of the thickness 410t of the substrate 410, e.g. smaller than about 5% of the thickness 410t of the substrate 410, e.g. smaller than about 2% of the thickness 410t of the substrate 410, e.g. smaller than about 1% of the thickness 410t of the substrate 410. The smaller the pore size of the substrate-supporting region 111 is, the more support to the substrate 410 may be provided. The pore size of the substrate-supporting region 111, e.g. of the pore network 113, may be a spatially averaged pore size, e.g. of the pores contacting the surface 111 of the substrate receiving region 111, e.g. in lateral direction. In other words, the surface 111s of the substrate receiving region 111 may include pores of the pore network 113, which are opened.

The processing arrangement 800a may optionally include an adaption layer 302 similar to the substrate carrier 300a, e.g. in the case of a small substrate 410. In this case an extension 410d (e.g. diameter) of the substrate 410 may be less than an extension 102d of the first portion 102 and greater than an extension 310d (e.g. diameter) of the permeable portion 302p. In other words, at least the second portion 104 may be free from the substrate 410. The adaption layer 302 may be disposed between the substrate 410 and the substrate-supporting region 111, and may cover the first portion 102 and the second portion 104. When a vacuum is created in the pore network 113 the substrate 410 is adhered by suction through the permeable portion 302p.

Figure 8B:
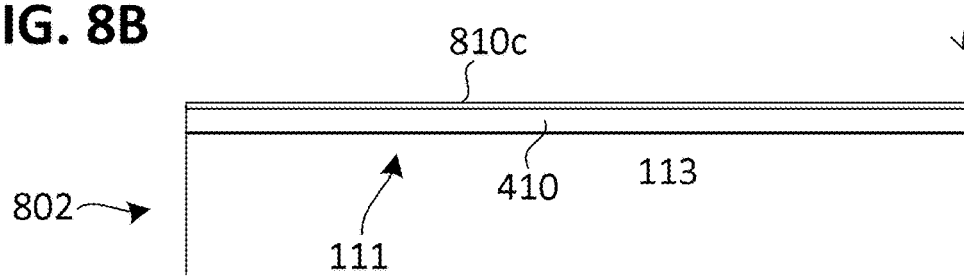

FIG. 8B illustrates a processing arrangement 800b according to various embodiments in a cross sectional view, wherein the substrate 410 includes a layer 810c, e.g. a polymer layer, on a side facing away from the substrate carrier 802. The layer 810c may include or be formed from at least one of: a protection layer or a mask layer.

Figure 8C:
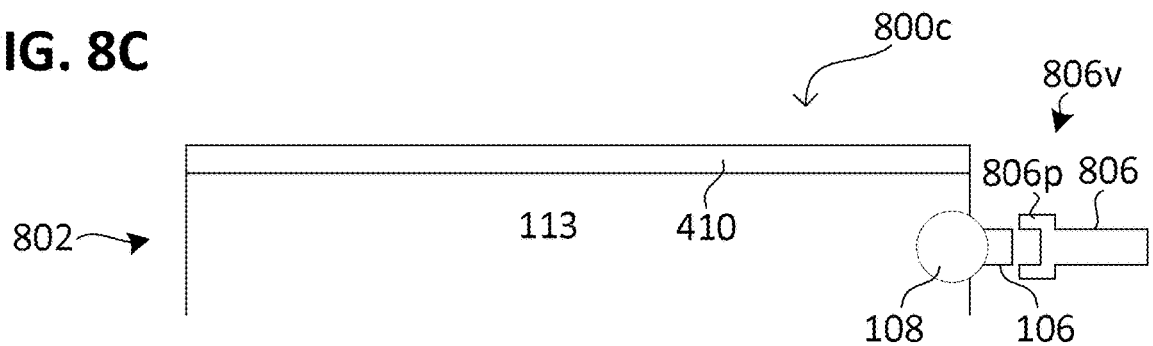

FIG. 8C illustrates a processing arrangement 800c according to various embodiments in a cross sectional view, wherein the processing arrangement 800c includes a vacuum system 806v configured to be coupled to the at least one evacuation port 106. The vacuum system 806v may be configured to create a vacuum in the pore network 113 of the substrate carrier 802. Therefore, the vacuum system 806v may include at least one vacuum pump (not shown); at least one vacuum supply line 806 (e.g. at least one vacuum conduits) including (e.g. each) at least one connection port 806p. The at least one connection port 806p may be configured to couple to the at least one evacuation port 106 for connecting the at least one evacuation port 106 to the at least one vacuum pump. The at least one vacuum pump may than create a vacuum in the pore network 113.

The at least one valve 108 may be configured to control the connection between the pore network 113 and the at least one evacuation port 106 based on at least one of the following: a coupling state of the at least one evacuation port 106; a gas pressure difference between the pore network 113 and the at least one evacuation port 106; or an operation access to the at least one valve 108.

For example, the at least one valve 108 may be configured to switch between the opened-configuration and the closed-configuration based on a coupling state of the at least one evacuation port 106. In other words, the at least one valve 108 may be configured to switch into the opened-configuration when the at least one connection port 806p is coupled to the at least one evacuation port 106. Alternatively or additionally, the at least one valve 108 may be configured to switch into the closed-configuration when the at least one connection port 806p is decoupled (released) from the at least one evacuation port 106.

For example, the at least one valve 108 may be configured to switch between the opened-configuration and the closed-configuration based on a gas pressure difference between the pore network 113 and the at least one evacuation port 106. In other words, the at least one valve 108 may be configured to switch into the opened-configuration when a gas pressure at least one of in or at the at least one evacuation port 106 is less than a gas pressure at least one of in or at the pore network 113, for example, when the vacuum system 806v starts to create a vacuum from outside. Alternatively or additionally, the at least one valve 108 may be configured to switch into the closed-configuration when a gas pressure at least one of in or at the at least one evacuation port 106 is greater than a gas pressure at least one of in or at the pore network 113, for example, when the vacuum system 806v stops to create a vacuum from outside.

For example, the at least one valve 108 may be configured to switch between the opened-configuration and the closed-configuration based on an operation access to the at least one valve 108. In other words, the at least one valve 108 may be configured to switch into the opened-configuration when a first operation access is provided to the at least one valve 108. Alternatively or additionally, the at least one valve 108 may be configured to switch into the closed-configuration when a second operation access is provided to the at least one valve 108. An operation access may include or be formed from at least a mechanical signal. For example, an operation access may be provided by at least one of a physical contact for transmitting a mechanical signal to the at least one valve 108.

Figure 8D:
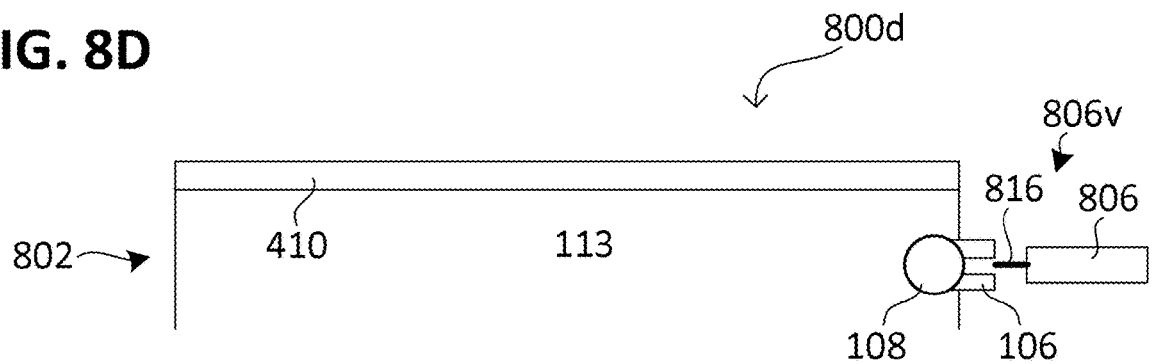

FIG. 8D illustrates a processing arrangement 800d according to various embodiments in a cross sectional view, wherein the vacuum system includes an operation pin 816. The operation pin 816 may be configured to extend into the at least one evacuation port 106 to form a physical contact with the at least one valve 108 for transmitting a mechanical signal, e.g. a force, to the at least one valve 108 for operating the at least one valve 108.

Figure 9A:
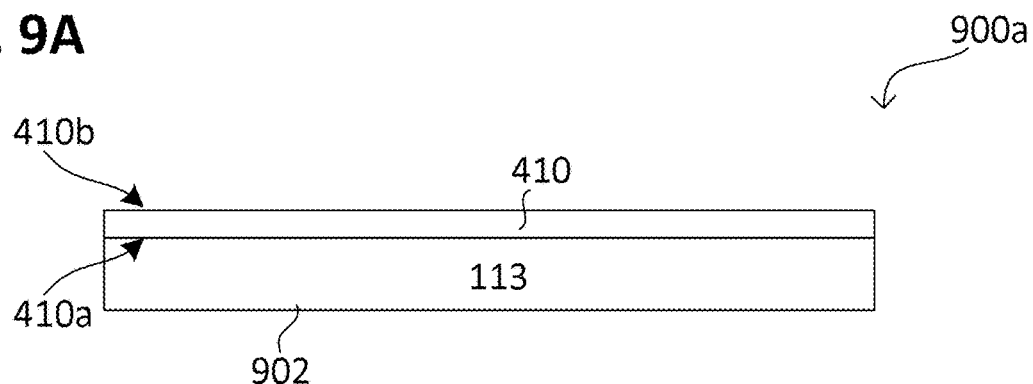
FIG. 9A to FIG. 9C respectively show a substrate carrier according to various embodiments in a method according to various embodiments in a cross sectional view.
Figure 9B:
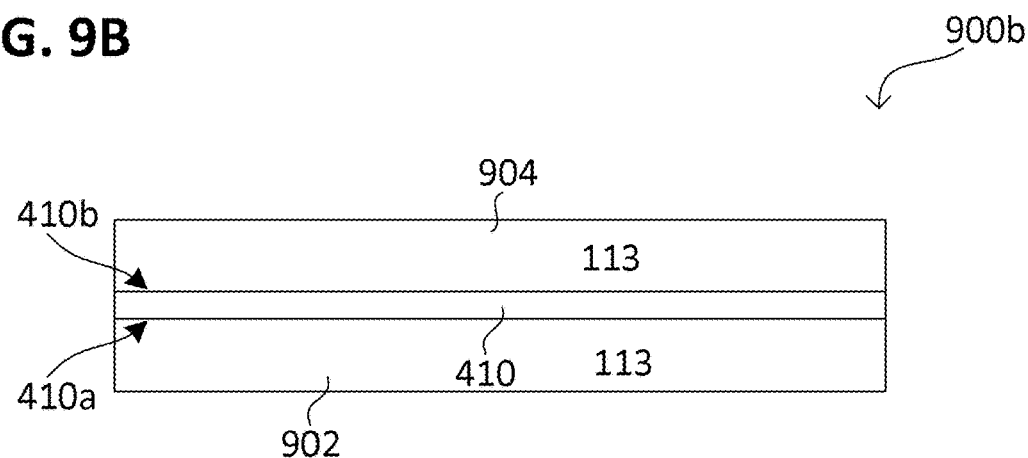
Figure 9C:
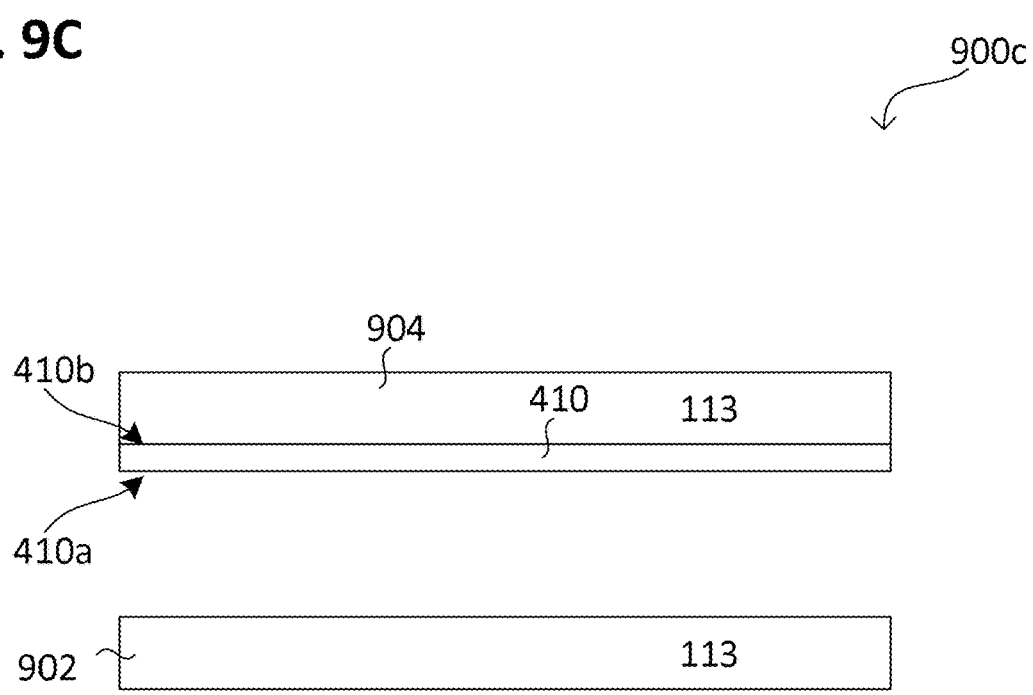

FIG. 9A to FIG. 9C respectively illustrate a substrate carrier according to various embodiments in a method according to various embodiments in a cross sectional view. The method may in 900a include adhering a first side 410a of a substrate 410 to a first substrate carrier 902 by evacuating a pore network 113 of the first substrate carrier 902. The first substrate carrier 902 may be configured similar to at least one of the substrate carriers described before, e.g. similar to at least one of the following: the substrate carrier 100a, the substrate carrier 200a, the substrate carrier 400a, the substrate carrier 500a, or the substrate carrier 600a to 600d.

The method may in 900b include adhering a second side 410b of the substrate 410 to a second substrate carrier 904 by evacuating a pore network 113 of the second substrate carrier 904. The second substrate carrier 904 may be configured similar to at least one of the substrate carriers described before, e.g. similar to at least one of the following: the substrate carrier 100a, the substrate carrier 200a, the substrate carrier 400a, the substrate carrier 500a, or the substrate carrier 600a to 600d.

The method may in 900c include releasing the substrate 410 from the first substrate carrier 902 after or sequentially to adhering the second side 410b of the substrate 410 to the second substrate carrier 904 by venting the pore network 113 of the first substrate carrier 902. Illustratively, the method may provide a handover procedure. Optionally, the substrate 410 includes a layer, e.g. a polymer layer, on at least one of: the first side 401a; or the second side 401b.

Optionally, the method may include processing the second side 410b of the substrate 410 after adhering the first side 410a of the substrate 410 to the first substrate carrier 902 and before adhering the second side 410b of the substrate 410 to a second substrate carrier 904. For example, the method may optionally include processing the second side 410b of the substrate 410 while the first side 410a of a substrate 410 is adhered to the first substrate carrier 902.

Optionally, the method may include releasing the substrate 410 from the second substrate carrier 904 after adhering the second side 410b of the substrate 410 to the second substrate carrier 904 by venting the pore network 113 of the second substrate carrier 904.

Optionally, the method may include processing the first side 410a of the substrate 410 after adhering the second side 410b of the substrate 410 to the second substrate carrier 904 and before releasing the substrate 410 from the second substrate carrier 904. For example, the method may optionally include processing the first side 410a of the substrate 410 while the second side 410b of a substrate 410 is adhered to the second substrate carrier 904.

Optionally, the method may include processing the first side 410a of the substrate 410 before adhering the first side 410a of the substrate 410 to the first substrate carrier 902.

Optionally, the method may include processing the second side 410b of the substrate 410 before adhering the second side 410b of the substrate 410 to the second substrate carrier 904.

According to various embodiments, processing the substrate 410 (on at least one of its first side 410a or its second side 410b) may include or be formed from at least one of the following: thinning, coating, heating, etching, cleaning, laminating, implanting, or printing.

Figure 10A:
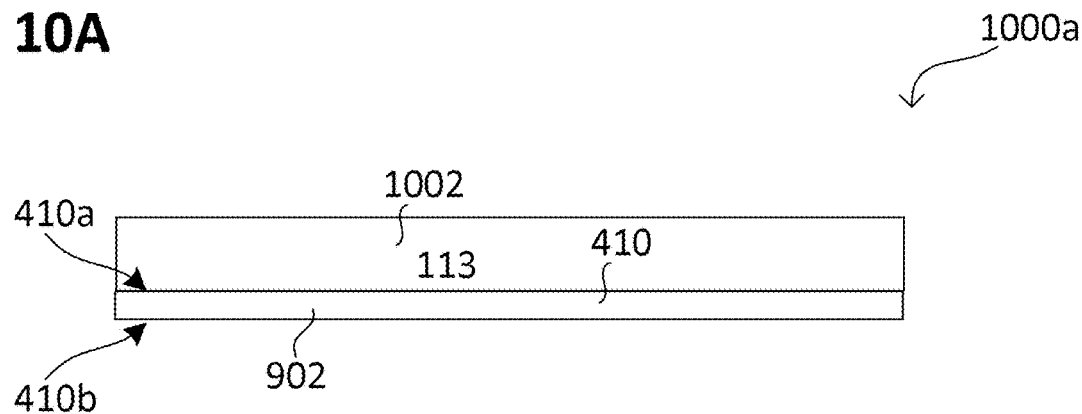
FIG. 10A to FIG. 10C respectively show a substrate carrier according to various embodiments in a method according to various embodiments in a cross sectional view.
Figure 10B:
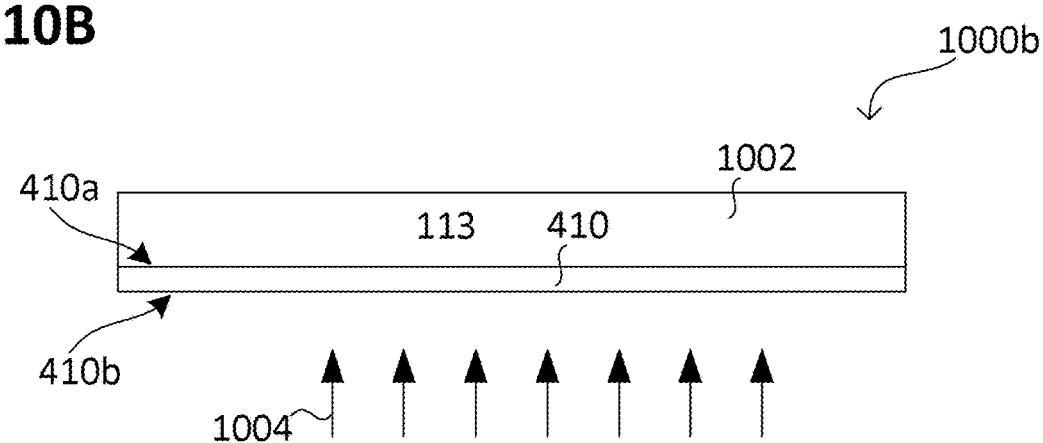
Figure 10C:
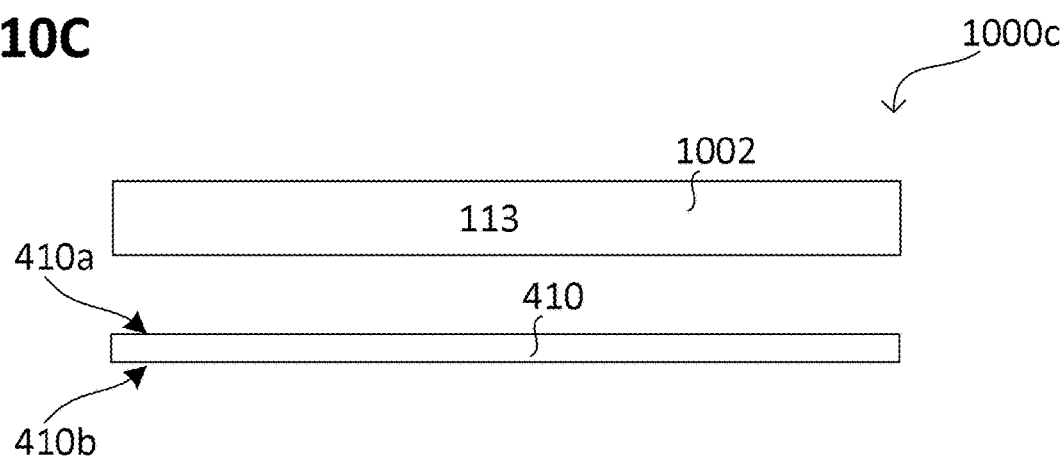

FIG. 10A to FIG. 10C respectively illustrate a substrate carrier 1002 according to various embodiments in a method according to various embodiments in a cross sectional view. The substrate carrier 1002 may be configured similar to at least one of the substrate carriers described before, e.g. similar to at least one of the following: the substrate carrier 100a, the substrate carrier 200a, the substrate carrier 400a, the substrate carrier 500a, or the substrate carrier 600a to 600d.

The method may in 1000a include adhering a first side 410a of a substrate 410 to a substrate carrier 1002 by evacuating a pore network 113 of the substrate carrier 1002, such that a gas pressure on the first side 410a of the substrate 410 is less than a gas pressure on a second side 410b of the substrate 410 opposite the first side 410a.

The method may in 1000b optionally include processing 1004 the second side 410b of the substrate 410 after adhering the first side 410a of the substrate 410 to the first substrate carrier 902. According to various embodiments, processing 1004 the substrate 410 (on its second side 410b) may include or be formed from at least one of the following: thinning, coating, heating, etching, cleaning, laminating, implanting, or printing.

The method may in 1000c include releasing the substrate 410 from the substrate carrier 1002 by venting the pore network 113 of the substrate carrier 1002, such that the gas pressure on the first side 410a of the substrate becomes greater than the gas pressure on the second side 410b. Optionally, releasing the substrate 410 from the substrate carrier 1002 may be done after processing 1004 the second side 410b of the substrate 410.

Figure 11A:
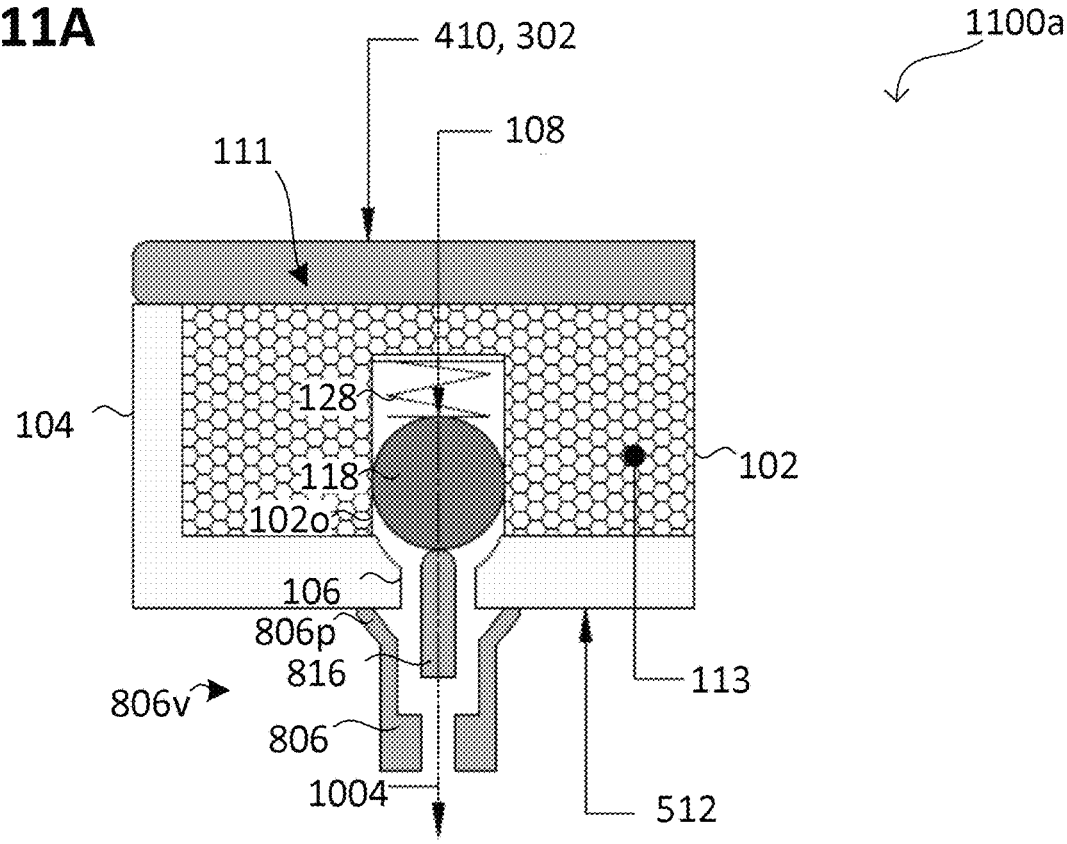
FIG. 11A and FIG. 11B respectively show a substrate carrier according to various embodiments in a cross sectional view.
Figure 11B:
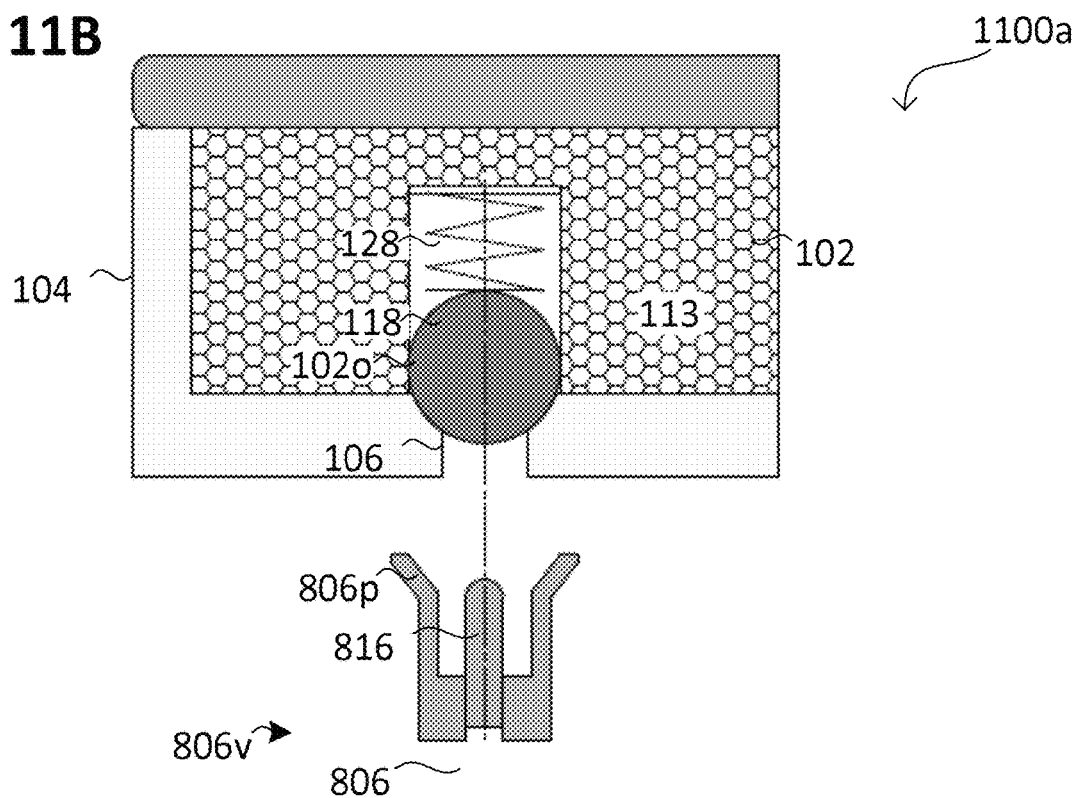

FIG. 11A and FIG. 11B respectively illustrate a substrate carrier 1100a according to various embodiments in a cross sectional view.

The at least one valve 108 may at least one of be disposed or extend in an opening 102o in the first portion 102 of the substrate-supporting region 111, e.g. at least one of a pore network or the porous carrier 513 (if present). Illustratively, the opening 102o may provide an increased contact surface to the pore network 113. This may facilitate creating a vacuum in the pore network 113.

The at least one valve 108 may include a valve sealing element 118, e.g. a sealing ball, and a spring element 128. In a closed-configuration of the at least one valve 108, the valve sealing element 118 may be pressed into a sealing position by the spring element 128, as illustrated in FIG. 11B. For example, the valve sealing element 118 may be pressed against a sealing surface of the at least one evacuation port 106. The at least one valve 108, e.g. its valve sealing element 118, may be exposed by the at least one evacuation port 106, such that the at least one valve 108, e.g. its valve sealing element 118, can be operated through the at least one evacuation port 106.

The valve sealing element 118 may be releasable from the sealing position by applying a mechanical signal, e.g. a force, to the valve sealing element 118, as illustrated in FIG. 11A. The force may be transferred to the valve sealing element 118 by the pin 816 to switch the at least one valve 108 into the opened-configuration. In the opened-configuration of the at least one valve 108, the valve sealing element 118 may be distant from the sealing surface of the at least one evacuation port 106. In the opened-configuration air may be removed 1004 from the pore network 113 to create a vacuum in the pore network 113. In other words, in the opened-configuration the pore network 113 may be pumped (to remove air from the pore network 113).

By decoupling the vacuum system 806v from the least one evacuation port 106, the force may be released from the valve sealing element 118 for switching the at least one valve 108 into the closed-configuration, as illustrated in FIG. 11B.

Figure 12:
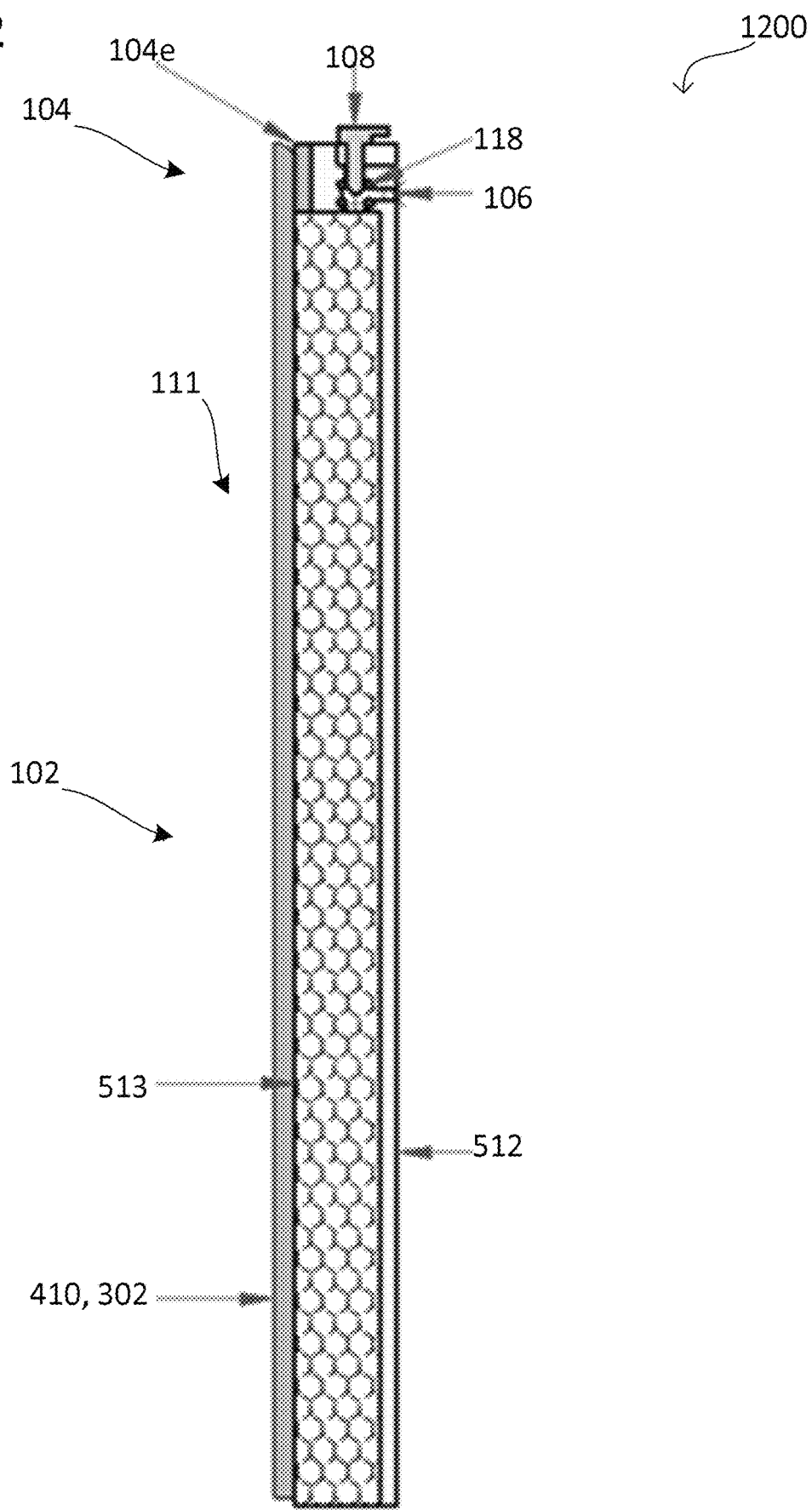
FIG. 12 shows a substrate carrier according to various embodiments in a cross sectional view.

FIG. 12 illustrates a substrate carrier 1200 according to various embodiments in a cross sectional view.

The substrate carrier 1200 may include at least one of: a carrier plate 512 (illustratively a frame or a corpus), an evacuation port 106 (e.g. including an evacuation line to the at least one valve 108), the at least one valve 108, a valve sealing element 118; a sealing element 104e, or a porous carrier 513 (e.g. a polymer plate).

The vacuum in the porous carrier 513 is created by coupling a vacuum system (not shown) with the evacuation port 106. The at least one valve 108 may be configured to switch into the closed-configuration if a predetermined pressure is reached in the porous carrier 513 (illustratively, a predetermined vacuum level), e.g. closing the evacuation line to the at least one valve 108.

The sealing member 104e (sealing element 104e) may be configured to stabilize the substrate 410 (or the adaption layer 302) on the substrate-supporting region 111 during the vacuum is created. Illustratively, the sealing element 104e may be configured to avoid the substrate 410 (or the adaption layer 302) slipping from the substrate-supporting region 111. The substrate 410 (or the adaption layer 302) may be in direct physical contact with the porous carrier 513. If necessary, a support layer (e.g. including a net structure), e.g. the support layer being completely perforated, may be disposed between the substrate 410 (or the adaption layer 302) and the porous carrier 513. The porous carrier 513 may stabilize the substrate 410 (or the adaption layer 302) mechanically.

At least one of the second portion 104, the carrier plate 512, or the sealing element 104e may include a porous free material. According to various embodiments, a permeability (permeability coefficient) of at least one of: the first portion 102, the pore network 113, or the porous carrier 513 may be greater than a permeability of at least one of the second portion 104, the carrier plate 512, or the sealing element 104e. A permeability of at least one of: the first portion 102, the pore network 113, or the porous carrier 513 may be greater than about $10^{-15}$ m$^2$ s$^{-1}$, e.g. greater than about $10^{-10}$ m$^2$ s$^{-1}$, e.g. greater than about $10^{-5}$ m$^2$ s$^{-1}$. A permeability of at least one of the second portion 104, the carrier plate 512, or the sealing element 104e may be less than about $10^{-15}$ m$^2$ s$^{-1}$, e.g. greater than about $10^{-16}$ m$^2$ s$^{-1}$, e.g. greater than about $10^{-17}$ m$^2$ s$^{-1}$.

Further, preferred embodiments will be described in the following:

According to various embodiments, a substrate carrier may include: a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network.

According to various embodiments, a substrate carrier may include a substrate-supporting region for supporting a substrate; wherein a first portion of the substrate-supporting region includes a first pore network of at least partially interconnected pores and a second pore network of at least partially interconnected pores, wherein the first pore network and the second pore network are spatially separated from each other; wherein a second portion of the substrate-supporting region surrounds the first portion and includes a sealing member for providing a contact sealing; at least one evacuation port for creating a vacuum in at least one of the first pore network or the second pore network, such that a substrate received over the substrate-supporting region is adhered by suction; and at least one valve configured to control a connection at least one of: between the first pore network and the at least one evacuation port, or between the second pore network and the at least one evacuation port, such that a vacuum can be maintained in at least one of the first pore network or the second pore network.

According to various embodiments, a substrate carrier may include: a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; at least one valve configured to control a connection between the pore network and the at least one evacuation port, such that a vacuum can be maintained in the pore network; and an adaption layer disposed over the substrate-supporting region and including a permeable portion with an extension which is less than an extension of the first portion for adapting a spatial suction distribution.

According to various embodiments, a substrate carrier may include: a substrate-supporting region for supporting a substrate; wherein a first portion of the substrate-supporting region includes a pore network of at least partially interconnected pores; wherein a second portion of the substrate-supporting region surrounds the first portion and includes an elastomer for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network.

According to various embodiments, a substrate carrier may include: a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; at least one valve configured to control a connection between the pore network and the at least one evacuation port, such that a vacuum can be maintained in the pore network; a recess; and a porous carrier including the first portion, wherein the porous carrier is detachably received in the recess.

According to various embodiments, a substrate carrier may include: a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; wherein the pore network includes a first pore characteristic in a first region and a second pore characteristic in a second region different from the first pore characteristic.

According to various embodiments, the pore characteristic includes at least one of: a spatial pore-density; a spatial pore-size; or a porosity.

According to various embodiments, a substrate carrier may include: a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; wherein the pore network includes a gradient in at least one of the following pore characteristics: a spatial pore-density; a spatial pore-size; or a porosity.

According to various embodiments, the substrate carrier may further include: a recess; and a porous carrier including the first portion, wherein the porous carrier is disposed in the recess, such that the porous carrier physically contacts a bottom of the recess opposite the substrate-supporting region.

According to various embodiments, the substrate carrier may further include: an evacuation line structure coupling the pore network with the at least one evacuation port and including at least one of: an evacuation line at least partially extending into the pore network, or an evacuation line at least partially surrounding the pore network.

According to various embodiments, a pore size of the pore network is less than about 150 µm, e.g. less than about 100 µm, e.g. less than about 50 µm, e.g. less than about 10 µm, e.g. less than about 5 µm, e.g. less than about 2 µm, e.g. less than about 1 µm, e.g. less than about 0.5 µm, e.g. less than about 0.2 µm, e.g. less than about 0.1 µm, e.g. greater than about 0.01 µm.

According to various embodiments, the first pore characteristic is greater than the second pore characteristic in at least one of: a spatial pore-density; a spatial pore-size; or a porosity.

According to various embodiments, a distance of the first region to a surface of the substrate-supporting region is greater than a distance of the second region to the surface of the substrate-supporting.

According to various embodiments, the second region is disposed proximate to (e.g. in physical contact with) a surface of the substrate-supporting region and the first region is disposed proximate to (e.g. in physical contact with) the at least one valve.

According to various embodiments, the pore network includes a gradient in a pore characteristic, wherein the gradient is in a direction from the second region to the first region.

According to various embodiments, the substrate carrier may further include: a recess; and a porous carrier including the first portion, wherein the porous carrier is disposed in the recess.

According to various embodiments, the porous carrier is detachably received in the recess.

According to various embodiments, the substrate carrier may further include: a carrier plate in which the recess is formed.

According to various embodiments, the first portion may include or be formed from a frame.

According to various embodiments, the carrier plate may include or be formed from a frame.

According to various embodiments, the first portion of the (e.g. at least substantially planar) substrate-supporting region includes a further pore network of at least partially interconnected pores, wherein the pore network and the further pore network are spatially separated from each other.

According to various embodiments, the pore network may be provided in the first region and the further pore network may be provided in the second region; or the further pore network may include a first pore characteristic in a first region and a second pore characteristic in a second region different from the first pore characteristic.

According to various embodiments, the at least one valve is further configured to control a connection between the further pore network and the at least one evacuation port, such that a vacuum can be maintained in the further pore network.

According to various embodiments, the at least one valve is configured for evacuating the pore network and the further pore network serially.

According to various embodiments, the at least one valve is configured for evacuating the pore network and the further pore network simultaneously.

According to various embodiments, the at least one valve includes at least a first valve and a second valve, wherein the first valve is configured for evacuating the pore network and wherein the second valve is configured for evacuating the further pore network.

According to various embodiments, the first valve is configured to control a connection between the pore network and the at least one evacuation port, such that a vacuum can be maintained in the pore network.

According to various embodiments, the second valve is configured to control a connection between the further pore network and the at least one evacuation port, such that a vacuum can be maintained in the further pore network.

According to various embodiments, the at least one evacuation port includes a first evacuation port and a second evacuation port.

According to various embodiments, the first valve is configured to control a connection between the pore network and the first evacuation port, such that a vacuum can be maintained in the pore network.

According to various embodiments, the second valve is configured to control a connection between the further pore network and the second evacuation port, such that a vacuum can be maintained in the further pore network.

According to various embodiments, the substrate carrier may include a plurality of pore networks, wherein the plurality of pore networks include the first pore network and the second pore network.

According to various embodiments, the substrate carrier may include a plurality of evacuation ports, wherein the plurality of evacuation ports include the first evacuation port and the second evacuation port.

According to various embodiments, the substrate carrier may include a plurality of valves, wherein the plurality of valves include the first valve and the second valve.

According to various embodiments, the pore network and the further pore network are radially separated from each other.

According to various embodiments, the pore network and the further pore network are peripheral separated from each other.

According to various embodiments, the pore network surrounds the further pore network.

According to various embodiments, the first portion of the (e.g. at least substantially planar) substrate-supporting region includes a sealing member disposed between the pore network and the further pore network.

According to various embodiments, the sealing member disposed between the pore network and the further pore network may include or be formed from an elastomer.

According to various embodiments, a pore characteristic of the pore network is different from a pore characteristic of the further pore network.

According to various embodiments, a pore characteristic of the pore network is equal to a pore characteristic of the further pore network.

According to various embodiments, the substrate carrier may further include: an adaption layer disposed over the (e.g. at least substantially planar) substrate-supporting region and including a permeable portion with an extension which is less than an extension of the first portion for adapting a spatial suction distribution.

According to various embodiments, the adaption layer includes a non-permeable portion disposed partially over the first portion and at least partially over the second portion; wherein the permeable portion is disposed partially over the first portion, such that a substrate received over the permeable portion is adhered by suction through the permeable portion.

According to various embodiments, the permeable portion includes at least one opening extending through the adaption layer.

According to various embodiments, the permeable portion is an opening extending through the adaption layer.

According to various embodiments, the permeable portion includes a plurality of openings, each opening of the plurality of openings extending through the adaption layer.

According to various embodiments, the permeable portion is perforated.

According to various embodiments, the substrate carrier may further include a hollow reservoir coupled with the pore network.

According to various embodiments, the pore network includes a first pore characteristic in a first region and a second pore characteristic in a second region different from the first pore characteristic.

According to various embodiments, the pore network includes a gradient in at least one of the following pore characteristics: a spatial pore-density; a spatial pore-size; or a porosity.

According to various embodiments, the gradient is in a direction from a surface of the substrate-supporting region to a bottom of the substrate carrier.

According to various embodiments, the gradient is in a direction from a surface of the substrate-supporting region to at least one of: an evacuation line structure, the at least one valve, the hollow reservoir, a bottom of the recess (if present), or a bottom of the porous carrier (if present).

According to various embodiments, a pore characteristic of the pore network proximate to the surface of the substrate-supporting region is greater than a pore characteristic of the pore network proximate to at least one of: a bottom of the substrate carrier or the at least one valve.

According to various embodiments, pores of the pore network proximate to the surface of the substrate-supporting region are smaller than pores of the pore network proximate to the at least one valve. In other words, a pore size of the pore network proximate to the surface of the substrate-supporting region is smaller than pore size of the pore network proximate to the at least one valve.

According to various embodiments, the at least one valve may be disposed proximate to the bottom of the substrate carrier According to various embodiments, pores of the pore network proximate to the surface of the substrate-supporting region are smaller than pores of the pore network proximate to the bottom of the substrate carrier, wherein the at least one valve is disposed proximate to the bottom of the substrate carrier.

According to various embodiments, a pore characteristic of the pore network proximate to the surface of the substrate-supporting region is smaller than a pore characteristic of the pore network proximate to the bottom of the substrate carrier, wherein the at least one valve is disposed proximate to the bottom of the substrate carrier.

According to various embodiments, the gradient may be in a vertical direction.

According to various embodiments, the further pore network includes a gradient in at least one of the following pore characteristics: a spatial pore-density; a spatial pore-size; or a porosity.

According to various embodiments, the pore network includes at least one of the following: micropores; macropores; or mesopores.

According to various embodiments, the further pore network includes at least one of the following: micropores; macropores; or mesopores.

According to various embodiments, the first portion includes at least one of the following: an aggregate of particles; a solid foam; or a partially eroded material.

According to various embodiments, the first portion includes at least one of the following materials: a metal, a ceramic, a glass, a polymer, or a semiconductor material According to various embodiments, the at least one valve is configured to control the connection between the pore network and the at least one evacuation port based on at least one of the following: a coupling state of the at least one evacuation port; a gas pressure difference between the pore network and the at least one evacuation port; or an operation access to the at least one valve.

According to various embodiments, the first valve is configured to control the connection between the pore network and the at least one evacuation port based on at least one of the following: a coupling state of the at least one evacuation port; a gas pressure difference between the pore network and the at least one evacuation port; or an operation access to the at least one valve.

According to various embodiments, the second valve is configured to control the connection between the further pore network and the at least one evacuation port based on at least one of the following: a coupling state of the at least one evacuation port; a gas pressure difference between the pore network and the at least one evacuation port; or an operation access to the at least one valve.

According to various embodiments, the substrate carrier may further include a support layer disposed over the (e.g. at least substantially planar) substrate-supporting region, wherein the support layer includes a net structure.

According to various embodiments, the at least one valve includes a spring element and a valve sealing element, wherein the valve sealing element is pressed into a sealing position by the spring element, and wherein the valve sealing element is releasable from the sealing position by applying a mechanical signal to the valve sealing element.

According to various embodiments, the at least one valve is exposed by the at least one evacuation port, such that the at least one valve can be operated through the at least one evacuation port.

According to various embodiments the substrate-supporting region is at least substantially planar, e.g. planar.

According to various embodiments, a processing arrangement may include: a substrate carrier, including: a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; the processing arrangement further including a substrate disposed over the substrate-supporting region of the substrate carrier; wherein a pore size of the substrate-supporting region is smaller than twice a thickness of the substrate.

According to various embodiments, a processing arrangement may include: a substrate carrier, including: a substrate-supporting region for supporting a substrate; wherein a first portion of the substrate-supporting region includes a first pore network of at least partially interconnected pores and a second pore network of at least partially interconnected pores, wherein the first pore network and the second pore network are spatially separated from each other; wherein a second portion of the substrate-supporting region surrounds the first portion and includes a sealing member for providing a contact sealing; at least one evacuation port for creating a vacuum in at least one of the first pore network or the second pore network, such that a substrate received over the substrate-supporting region is adhered by suction; and at least one valve configured to control a connection at least one of between the first pore network and the at least one evacuation port or between the second pore network and the at least one evacuation port, such that a vacuum can be maintained in at least one of the first pore network or the second pore network; the processing arrangement further including a substrate disposed over the substrate-supporting region of the substrate carrier; wherein a pore size of the substrate-supporting region is smaller than twice a thickness of the substrate.

According to various embodiments, a processing arrangement may include: a substrate carrier, including: a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; at least one valve configured to control a connection between the pore network and the at least one evacuation port, such that a vacuum can be maintained in the pore network; and an adaption layer disposed over the substrate-supporting region and including a permeable portion with an extension which is less than an extension of the first portion for adapting a spatial suction distribution; the processing arrangement further including a substrate disposed over the substrate-supporting region of the substrate carrier; wherein a pore size of the substrate-supporting region is smaller than twice a thickness of the substrate.

According to various embodiments, the adaption layer may be disposed between the substrate and the substrate-supporting region.

According to various embodiments, a processing arrangement may include: a substrate carrier, including: a substrate-supporting region for supporting a substrate; wherein a first portion of the substrate-supporting region includes a pore network of at least partially interconnected pores; wherein a second portion of the substrate-supporting region surrounds the first portion and includes an elastomer for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; the processing arrangement further including a substrate disposed over the substrate-supporting region of the substrate carrier; wherein a pore size of the substrate-supporting region is smaller than twice a thickness of the substrate.

According to various embodiments, a processing arrangement may include: a substrate carrier, including: a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; at least one valve configured to control a connection between the pore network and the at least one evacuation port, such that a vacuum can be maintained in the pore network; a recess; and a porous carrier including the first portion, wherein the porous carrier is detachably received in the recess; the processing arrangement further including a substrate disposed over the substrate-supporting region of the substrate carrier; wherein a pore size of the substrate-supporting region is smaller than twice a thickness of the substrate.

According to various embodiments, a processing arrangement may include: a substrate carrier, including: a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; wherein the pore network includes a first pore characteristic in a first region and a second pore characteristic in a second region different from the first pore characteristic; the processing arrangement further including a substrate disposed over the substrate-supporting region of the substrate carrier; wherein a pore size of the substrate-supporting region is smaller than twice a thickness of the substrate.

According to various embodiments, a processing arrangement may include a substrate carrier, including: a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; wherein the pore network includes a gradient in at least one of the following pore characteristics: a spatial pore-density; a spatial pore-size; or a porosity; the processing arrangement further including a substrate disposed over the substrate-supporting region of the substrate carrier; wherein a pore size of the substrate-supporting region is smaller than twice a thickness of the substrate.

According to various embodiments, a pore size of the substrate-supporting region is smaller than about 50% a thickness of the substrate.

According to various embodiments, a pore size of the substrate-supporting region is smaller than about 10% a thickness of the substrate.

According to various embodiments, a pore size of the substrate-supporting region is greater than about 1% a thickness of the substrate.

According to various embodiments, a pore size of the substrate-supporting region is greater than about 0.1% a thickness of the substrate.

According to various embodiments, the processing arrangement may further include an adaption layer disposed at least partially between the substrate and the substrate-supporting region; wherein the adaption layer includes a non-permeable portion partially covering the first portion of the substrate-supporting region and being at least partially free of the substrate; and wherein the adaption layer includes a permeable portion between the first portion of the substrate-supporting region and the substrate, such that the substrate is adhered by suction through the permeable portion.

According to various embodiments, the substrate includes a polymer layer on a side facing away from the substrate carrier.

According to various embodiments, the processing arrangement may further include: a vacuum system configured to be coupled to the at least one evacuation port and configured to create a vacuum in the pore network of the substrate carrier.

According to various embodiments, the vacuum system includes an operation pin configured to apply a mechanical signal to the at least one valve of the substrate carrier for operating the at least one valve.

According to various embodiments, the processing arrangement may further include a transport system configured to transport the substrate carrier through a processing region.

According to various embodiments, a method may include adhering a first side of a substrate to a first substrate carrier by evacuating a pore network of the first substrate carrier; adhering a second side of the substrate to a second substrate carrier by evacuating a pore network of the second substrate carrier; and releasing the substrate from the first substrate carrier after adhering the second side of the substrate to the second substrate carrier by venting the pore network of the first substrate carrier.

According to various embodiments, the substrate includes a polymer layer on at least one of: the first side, or the second side.

According to various embodiments, a method may include: adhering a first side of a substrate to a substrate carrier by evacuating a pore network of the substrate carrier, such that a gas pressure on the first side of the substrate is less than a gas pressure on a second side of the substrate opposite the first side; and releasing the substrate from the substrate carrier by venting the pore network of the substrate carrier, such that the gas pressure on the first side of the substrate becomes greater than the gas pressure on the second side.

According to various embodiments, the gas pressure on the first side of the substrate for releasing the substrate from the substrate carrier is greater than atmospheric pressure.

According to various embodiments, the substrate includes a polymer layer on at least one of: the first side, or the second side.

According to various embodiments, a method may include: adhering a substrate to a substrate carrier by suction, wherein the substrate carrier may include: a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; and processing the substrate.

According to various embodiments, a method may include: adhering a substrate to a substrate carrier by suction, wherein the substrate carrier may include: a substrate-supporting region for supporting a substrate; wherein a first portion of the substrate-supporting region includes a first pore network of at least partially interconnected pores and a second pore network of at least partially interconnected pores, wherein the first pore network and the second pore network are spatially separated from each other; wherein a second portion of the substrate-supporting region surrounds the first portion and includes a sealing member for providing a contact sealing; at least one evacuation port for creating a vacuum in at least one of the first pore network or the second pore network, such that a substrate received over the substrate-supporting region is adhered by suction; and at least one valve configured to control a connection at least one of between the first pore network or the at least one evacuation port and between the second pore network and the at least one evacuation port, such that a vacuum can be maintained in at least one of the first pore network or the second pore network; and processing the substrate.

According to various embodiments, a method may include: adhering a substrate to a substrate carrier by suction, wherein the substrate carrier may include a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; at least one valve configured to control a connection between the pore network and the at least one evacuation port, such that a vacuum can be maintained in the pore network; and an adaption layer disposed over the substrate-supporting region and including a permeable portion with an extension which is less than an extension of the first portion for adapting a spatial suction distribution; and processing the substrate.

According to various embodiments, a method may include: adhering a substrate to a substrate carrier by suction, wherein the substrate carrier may include a substrate-supporting region for supporting a substrate; wherein a first portion of the substrate-supporting region includes a pore network of at least partially interconnected pores; wherein a second portion of the substrate-supporting region surrounds the first portion and includes an elastomer for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; and processing the substrate.

According to various embodiments, a method may include: adhering a substrate to a substrate carrier by suction, wherein the substrate carrier may include a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; at least one valve configured to control a connection between the pore network and the at least one evacuation port, such that a vacuum can be maintained in the pore network; a recess; and a porous carrier including the first portion, wherein the porous carrier is detachably received in the recess; and processing the substrate.

According to various embodiments, a method may include: adhering a substrate to a substrate carrier by suction, wherein the substrate carrier may include a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; wherein the pore network includes a first pore characteristic in a first region and a second pore characteristic in a second region different from the first pore characteristic; and processing the substrate.

According to various embodiments, a method may include: adhering a substrate to a substrate carrier by suction, wherein the substrate carrier may include a substrate-supporting region for supporting a substrate; wherein a first portion of the substrate-supporting region includes a pore network of at least partially interconnected pores; wherein a second portion of the substrate-supporting region surrounds the first portion and includes a sealing member for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; wherein the pore network includes a gradient in at least one of the following pore characteristics: a spatial pore-density; a spatial pore-size; a porosity; or processing the substrate.

According to various embodiments, processing the substrate includes at least one front-end processing step.

According to various embodiments, processing the substrate includes at least one back-end processing step.

According to various embodiments, processing the substrate includes at least one of the following: thinning, coating, heating, etching, cleaning, laminating, implanting, or printing.

According to various embodiments, the substrate includes a polymer layer at least on a side opposite the substrate carrier.

According to various embodiments, a substrate carrier may include: at least one recess; at least one porous carrier disposed in the at least one recess and including a network of at least partially interconnected pores; an elastomeric contact sealing surrounding the at least one recess; at least one evacuation port for evacuating the at least one porous carrier; and at least one valve configured to control a connection between the porous carrier and the at least one evacuation port, such that a vacuum can be maintained in the porous carrier; wherein the elastomeric contact sealing and the at least one porous carrier form an at least substantially planar surface, such that a planar substrate disposed over the elastomeric contact sealing is supported by the porous carrier.

What is claimed is:
1. A substrate carrier comprising:
a substrate-supporting region for supporting a substrate;
wherein a first portion of the substrate-supporting region comprises a pore network of at least partially interconnected pores;
wherein a second portion of the substrate-supporting region surrounds the first portion and comprises a sealing member for providing a contact sealing;
at least one evacuation port for creating a vacuum in the pore network, such that the substrate received over the substrate-supporting region is adhered by suction; and
at least one valve configured to control a connection between the pore network and the at least one evacuation port, such that the vacuum can be maintained in the pore network;
a porous carrier, in which the first portion is formed, wherein the valve extends into the porous carrier;
wherein the pore network comprises a first pore characteristic in a first region and a second pore characteristic in a second region different from the first pore characteristic; and
wherein the pore network comprises a gradient in a pore characteristic, wherein the gradient is in a direction from the second region to the first region, wherein the pore characteristic changes in different locations of each of said first region and second region.

2. The substrate carrier of claim 1, further comprising:
an evacuation line structure coupling the pore network with the at least one evacuation port and comprising at least one of: an evacuation line at least partially extending into the pore network, or an evacuation line at least partially surrounding the pore network.

3. The substrate carrier of claim 1, further comprising:
a recess, wherein the porous carrier is detachably received in the recess.

4. The substrate carrier of claim 1, further comprising:
a recess, wherein the porous carrier physically contacts a bottom of the recess opposite the substrate-supporting region.

5. The substrate carrier of claim 1,
wherein the first pore characteristic is greater than the second pore characteristic in at least one of:
a spatial pore-density;
a spatial pore-size; or
a porosity.

6. The substrate carrier of claim 1,
wherein the second region is disposed proximate to a surface of the substrate-supporting region and the first region is disposed proximate to the at least one valve.

7. The substrate carrier of claim 1,
wherein the substrate-supporting region comprises a further pore network of at least partially interconnected pores, wherein the pore network and the further pore network are spatially separated from each other.

8. The substrate carrier of claim 1,
wherein the first portion comprises at least one of the following materials: a metal, a ceramic, a glass, a polymer, or a semiconductor material.

9. The substrate carrier of claim 1,
wherein the at least one valve is exposed by the at least one evacuation port, such that the at least one valve can be operated through the at least one evacuation port.

10. A substrate carrier comprising:

a substrate-supporting region for supporting a substrate;

wherein a first portion of the substrate-supporting region comprises a pore network of at least partially interconnected pores;

wherein a second portion of the substrate-supporting region surrounds the first portion and comprises a sealing member for providing a contact sealing;

at least one evacuation port for creating a vacuum in the pore network, such that the substrate received over the substrate-supporting region is adhered by suction; and at least one valve configured to control a connection between the pore network and the at least one evacuation port, such that the vacuum can be maintained in the pore network, wherein the valve extends and is at least partially located inside the first portion;

wherein the pore network comprises a first pore characteristic in a first region and a second pore characteristic in a second region, which are spatially distant from each other, wherein the pore network comprises a gradient in at least one of the following pore characteristics:

a spatial pore-density;

a spatial pore-size; or a porosity;

wherein the gradient is extended at least from the first region to the second region.

11. The substrate carrier of claim 10, wherein pores of the pore network proximate to a surface of the substrate-supporting region are smaller than pores of the pore network proximate to the at least one valve.

12. The substrate carrier of claim 10, further comprising:

a recess; and a porous carrier comprising the first portion, wherein the porous carrier is disposed in the recess.

13. The substrate carrier of claim 12, wherein the porous carrier physically contacts a bottom of the recess opposite the substrate-supporting region.

14. The substrate carrier of claim 12, wherein the porous carrier is detachably received in the recess.

15. The substrate carrier of claim 10, further comprising:

wherein the gradient is in a direction from a surface of the substrate-supporting region to a bottom of the substrate carrier.

16. A processing arrangement comprising:

a substrate carrier, comprising;

a substrate-supporting region for supporting a substrate;

wherein a first portion of the substrate-supporting region comprises a pore network of at least partially interconnected pores;

wherein a second portion of the substrate-supporting region surrounds the first portion and comprises a sealing member for providing a contact sealing;

at least one evacuation port for creating a vacuum in the pore network, such that the substrate received over the substrate-supporting region is adhered by suction; and at least one valve configured to control a connection between the pore network and the at least one evacuation port, such that the vacuum can be maintained in the pore network;

wherein the pore network comprises a first pore characteristic in a first region and a second pore characteristic in a second region different from the first pore characteristic;

the substrate disposed over the substrate-supporting region of the substrate carrier; wherein a pore size of the substrate-supporting region is smaller than twice a thickness of the substrate;

a removable adaption layer disposed at least partially between the substrate and the substrate-supporting region;

wherein the adaption layer comprises a non-permeable portion covering a fraction in the range from about 10% to about 90% of the pore network and being at least partially free of the substrate; and wherein the adaption layer comprises a permeable portion between the first portion of the substrate-supporting region and the substrate, such that the substrate is adhered by suction through the permeable portion.

17. The processing arrangement of claim 16, wherein the at least one valve is configured to control a connection between the pore network and the at least one evacuation port, such that the vacuum can be maintained in the pore network by the at least one valve, when the at least one evacuation port is disconnected from a vacuum source.

18. The processing arrangement of claim 16, wherein the adaption layer includes another permeable portion, wherein the non-permeable portion separates the permeable portion and the another permeable portion.

19. The processing arrangement of claim 16, wherein the adaption layer comprises a foil.

* * * * *